US007535037B2

(12) United States Patent
Lyu

(10) Patent No.: US 7,535,037 B2
(45) Date of Patent: May 19, 2009

(54) SOLID STATE IMAGE SENSOR DEVICES HAVING NON-PLANAR TRANSISTORS

(75) Inventor: Jeong Ho Lyu, Suwon-Si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 509 days.

(21) Appl. No.: 11/211,300

(22) Filed: Aug. 25, 2005

(65) Prior Publication Data

US 2006/0081887 A1 Apr. 20, 2006

(30) Foreign Application Priority Data

Oct. 20, 2004 (KR) .................. 10-2004-0083968

(51) Int. Cl.
*H01L 29/768* (2006.01)
(52) U.S. Cl. .............. 257/215; 257/291; 257/292; 257/463
(58) Field of Classification Search ........... 257/291, 257/292, 461, 463, 465, 242–244, 59, 72, 257/222, 225, 232, 444, E27.133, E31.097, 257/414; 438/73
See application file for complete search history.

(56) References Cited

U.S. PATENT DOCUMENTS

| 4,760,273 | A | * | 7/1988 | Kimata ............... 250/208.1 |
| 6,734,471 | B2 | | 5/2004 | Kim |
| 7,084,443 | B2 | * | 8/2006 | Kitano et al. .......... 257/291 |
| 7,217,968 | B2 | * | 5/2007 | Adkisson et al. ....... 257/292 |
| 2004/0251482 | A1 | * | 12/2004 | Rhodes .................. 257/292 |
| 2004/0262609 | A1 | * | 12/2004 | Mouli et al. ............ 257/72 |

FOREIGN PATENT DOCUMENTS

DE 3529025 C2 2/1986

\* cited by examiner

*Primary Examiner*—Dao H Nguyen
*Assistant Examiner*—Tram H Nguyen
(74) *Attorney, Agent, or Firm*—F. Chau & Associates, LLC.

(57) ABSTRACT

CMOS image sensor devices are provided, wherein active pixel sensors are designed with non-planar transistors having vertical gate electrodes and channels, which minimize the effects of image lag and dark current.

22 Claims, 25 Drawing Sheets

SOLID STATE IMAGE SENSOR DEVICES HAVING NON-PLANAR TRANSISTORS

CROSS-REFERENCE TO RELATED APPLICATION

This application claims priority to Korean Patent Application No. 10-2004-83968, filed on Oct. 20, 2004, which is fully incorporated herein by reference.

TECHNICAL FIELD OF THE INVENTION

The present invention relates generally to solid-state image sensor devices and, more specifically, to CMOS image sensor devices comprising active pixel sensors that are designed with non-planar transistors having vertical gate electrodes and channels, which minimize the effects of image lag and dark current.

BACKGROUND

Various types of solid state imaging devices have been developed, which primarily include charge-coupled devices (CCDs) and complementary metal oxide semiconductor (CMOS) image sensor devices, as well as hybrid image sensors that based on a combination of CCD and CMOS image sensor designs. In general, CCD and CMOS solid state imaging sensors CCD image sensors operate based on the "photoelectric effect", which occurs when silicon is exposed to light. In particular, CCD and CMOS image sensors include pixel arrays where each unit pixel includes a light receiving region including one or more photodetector elements (such as photodiodes) formed in an active silicon region of the pixel. When the light receiving region is exposed to light, photons in the visible and near-IR (infra red) light spectrums have sufficient energy to break covalent bonds in the silicon, thereby releasing electrons from the valence band into the conduction band. The amount of electrons generated is proportional to the light intensity. The photon-generated charges are accumulated by the photodetector elements in the pixel array, and then detected and processed to generate a digital image.

Historically, analog CCD image sensors have dominated the market for solid-state imaging applications due to various advantages afforded by CCD image sensors, including superior dynamic range, low FPN (fixed pattern noise) and high sensitivity to light. Advances in CMOS technologies, however, have led to the development of improved CMOS image sensor designs, thereby allowing CMOS solid state image sensors to displace CCDs in various solid state imaging applications. Solid state CMOS image sensors afford various advantages including, for example, low cost fabrication, low power consumption with a single voltage power supply, system-on-chip integration, high-speed operation (e.g., capturing sequential images at high frame rates), highly-integrated pixel arrays, on-chip image processing systems, random access to unit pixels, etc. In contrast, CCD image sensor devices are expensive to fabricate, typically require 2, 3 or more supply voltages at different clock speeds with significantly higher power consumption, and do not allow random access to unit pixels.

Conventional solid state CMOS image sensors, however, can suffer from low sensitivity and various sources of noise resulting in degraded performance. For example, some conventional CMOS image sensors are highly susceptible to noise such as dark current. As is known in the art, dark current is thermally generated charge that is produced in the absence of illumination and accumulated along with photon-generated charges. Dark current is typically generated as a result of surface damage (e.g., dangling silicon bonds) to the active silicon regions of the unit pixel, such as the photodiode region, resulting from manufacturing processes such as gate and spacer etching steps. In addition, dark current can be generated as a result of damage to the silicon at the interface between an isolation region and the active silicon region. In general, the amount of dark current produced is a function of temperature and time, and the amount of dark current produced can vary significantly from pixel to pixel depending upon operating conditions. As a result, dark current can result in reduced pixel sensitivity and lower the dynamic range of the image sensor device.

Moreover, CMOS image sensors can suffer from a phenomenon known as image lag. As is known in the art, image lag can result from an incomplete pixel reset, where the reset voltage of a photodiode or sense node of a pixel varies from a desired reference voltage reset level at the beginning of the reset operation. Moreover, image lag can result from an incomplete charge transfer from a photodiode to a sensing node of a given pixel. The ability of a CMOS image sensor to completely transfer charge between two regions depends on the electric field strength between the regions. In this regard, as CMOS image sensor devices are designed to operate with lower supply voltages to meet requirements for decreased power consumption, the ability to minimize image lag (due to incomplete charge transfer and reset) becomes more problematic.

SUMMARY OF THE INVENTION

Exemplary embodiments of the invention generally include CMOS image sensor devices. More specifically, exemplary embodiments of the invention include CMOS image sensor devices comprising active pixel sensors that are designed with non-planar transistors having vertical gate electrodes and channels, which minimize the effects of image lag and dark current.

In one exemplary embodiment of the invention, an image sensor device comprises a semiconductor substrate having a plurality of active regions that are defined by an isolation layer. The device further comprises a pixel array comprising a plurality of pixels, wherein each pixel is formed in one of the active regions. Each pixel comprises a light receiving element and a charge transfer element. The charge transfer element transfers charge from the light receiving element to, e.g., a floating diffusion region or sense node. The charge transfer element comprises a vertical channel region in the active region of the pixel to transfer the charge, a vertical gate electrode formed in the isolation layer and disposed adjacent to the vertical channel region, and insulating material disposed between the vertical channel region and vertical gate electrode.

In yet other exemplary embodiments of the invention, the light receiving element may be a photodiode or a pinning photodiode. The light receiving element may comprise a hole accumulation diode HAD formed in the active region, and an n-well region formed below the HAD.

To minimize image lag and other types of noise, the vertical gate electrode is formed to a depth to be adjacent to a least a portion of a charge accumulation region of the light receiving element. For instance, the vertical gate electrode can be formed to a depth below a HAD layer to be adjacent to at least a portion of the n-well region.

In another exemplary embodiment of the invention, the charge transfer element further includes a horizontal channel region in the active region of the pixel to transfer charge, a horizontal gate electrode disposed adjacent to the horizontal channel region, and insulating material disposed between the horizontal channel region and horizontal gate electrode.

In other exemplary embodiments of the invention, the horizontal gate electrode is formed on a surface of the semiconductor substrate, or at least a portion of the horizontal gate electrode is disposed in a recess formed in the surface of the semiconductor substrate. The horizontal gate electrode can be L-shaped or rectangular-shaped, for example. The vertical gate electrode is connected to, and extends from, a portion of the horizontal gate electrode that overlaps the isolation layer.

In another exemplary embodiment of the invention, an image sensor device comprises a plurality of active pixels formed in a substrate. An active pixel comprises a light receiving element, a reset transistor, a charge transfer element, a floating diffusion region, and an amplifier transistor. The reset transistor, the charge transfer element or the amplifier transistor may be constructed to have a vertical channel.

These and other exemplary embodiments, aspects, objects, features and advantages of the present invention will become apparent from the following detailed description of exemplary embodiments, which is to be read in connection with the accompanying drawings.

DETAILED DESCRIPTION OF EXEMPLARY EMBODIMENTS

Figure 1:
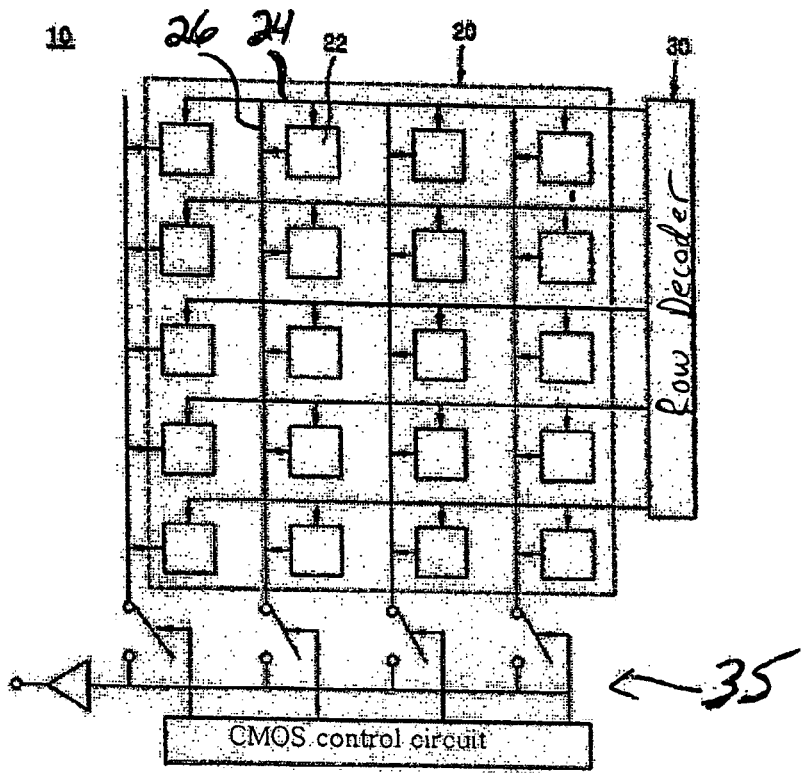
FIG. 1 is a high-level block diagram of a solid state CMOS image sensor device according to an exemplary embodiment of the invention.

Exemplary CMOS image sensor devices and methods for fabricating such devices according to exemplary embodiments of the invention will now be described more fully with reference to the accompanying drawings. It is to be understood that the drawings are merely schematic depictions where the thickness and dimensions of various components, layers and regions are not to scale, but rather exaggerated for purposes of clarity. It is to be further understood that when a layer is described herein as being "on" or "over" another layer or substrate, such layer may be directly on the other layer or substrate, or intervening layers may also be present. It is to be further understood that the same reference numerals used throughout the drawings denote elements that are the same or similar or have the same or similar functions.

FIG. 1 is a high-level block diagram of a solid state CMOS image sensor device according to an exemplary embodiment of the invention. In particular, FIG. 1 illustrates a CMOS image sensor device (10) including a pixel array (20) that comprises a plurality of unit pixels (22) arranged in an orthogonal grid of sensor rows and sensor columns. Depending on the application, the active pixel sensor array (20) may comprise any desired number of unit pixels (22) arranged in any number of rows and columns. As will be explained below, the unit pixels (22) in the pixel array (20) can be designed according to one of various pixel architectures having non-planar transistors according to exemplary embodiments of the invention, which minimize image lag and dark current.

The CMOS image sensor (10) further comprises CMOS control logic circuitry including row decoding logic (30) and output control logic (35). A plurality of control lines (24) extend from the row decoding logic (30) along corresponding rows of unit pixels (22) and are connected to corresponding unit pixels (22) in respective rows. An output port of each unit pixel (22) in a sensor column is coupled by a corresponding column output line (26) to the output control circuit (35) (which performs functions such as column sensing and multiplexing, for example). Although not specifically shown, the CMOS image sensor (10) may further include other on-chip mixed-signal circuits including analog signal processors, analog-to-digital converters, bias voltage generators, timing signal generators, digital logic and memory, etc., for controlling pixel signal reading and processing functions.

In operation, control signals are applied to the row decoder logic (30) to sequentially activate each row of unit pixels (22) via control lines (24) to detect the light intensity and to generate corresponding output voltage signals which are applied to column output lines (26). The CMOS control logic circuitry (30) and (35) can implement any known x-y addressing and timing protocol to control functions such as pixel reset, integration, and pixel readout operations for each sensor row of pixels (22) in the array (20).

Figure 2:
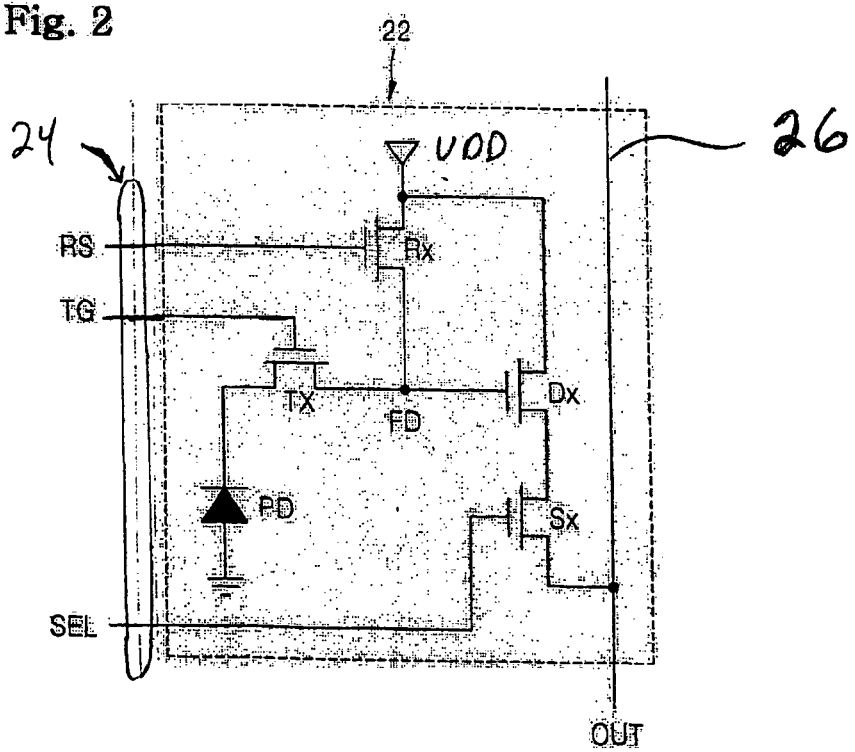
FIG. 2 is a schematic circuit diagram illustrating an active pixel sensor which can be constructed with non-planar transistors according to various exemplary embodiments of the invention.

FIG. 2 is a schematic circuit diagram illustrating a unit pixel of the CMOS image sensor device of FIG. 1, which can be constructed with non-planar transistors according to an exemplary embodiment of the invention. In particular, FIG. 2 schematically depicts the unit pixel (22) having a 4-transistor (4-T) active pixel sensor framework. In general, the exemplary unit pixel (22) comprises a PD (photodetector) element (or light receiving element), a transfer transistor TX, an FD (floating diffusion) region (or sense node), a reset transistor RX, an amplifier DX (or source follower amplifier), and a select transistor SX. The PD element may be a photodiode or a pinned photodiode, for example, which is formed in a light receiving region of the pixel (22). The PD element is coupled/decoupled to/from the FD region by operation of the transfer transistor TX. The reset transistor RX has a gate electrode connected to an RS control signal line. The transfer transistor TX has a gate electrode connected to a TG control signal line. The select transistor SX has a gate electrode connected to an SEL control signal line and a source electrode connected to an output (column) line (26).

The transistors RX, TX, DX and SX are operated to perform functions such as resetting the pixel, transferring accumulated charges from the PD element to the FD region, and converting the accumulated charges in the FD region to a measurable voltage that is amplified and transferred to the output line (26). More specifically, the exemplary unit pixel (22) operates as follows. Initially, during an integration period (or charge collection period), the pixel is illuminated with incident light and photo-generated charges are accumulated in a potential well (or charge accumulation region) of the PD element. After the integration period is complete, the reset transistor RX is activated by a reset control signal applied to the RS control signal line, to drain charge from the FD region and set the FD region to a reference potential (e.g., the FD region is charged to approximately the source voltage VDD less the threshold voltage of the reset transistor RX). After the reset operation, the transfer transistor TX is activated by a control signal applied to the TG control signal line to transfer the accumulated photo-generated charges from the PD element to the FD region. The amplifier transistor DX amplifies the voltage of the FD region and the amplified voltage is buffered/coupled to the column output line (26) via the select transistor SX, which is activated by a row select signal applied to the SEL control signal line.

With conventional designs of the unit pixel (22) of FIG. 2, dark current can be generated in various locations in the active silicon region of the pixel, including for example, the light receiving region, the charge transfer region between the PD and FD regions, and the FD region of the pixel. Moreover, the unit pixel (22) can suffer from image lag due to incomplete transfer of photo-generated charges from the PD region to the FD region by the transfer transistor TX and/or incomplete resetting of the FD region to the reference voltage by operation of the reset transistor RX. In accordance with exemplary embodiments of the invention as described in detail hereafter, the transfer and reset transistors TX and RX of active pixel sensors are designed to minimize dark current and image lag effects.

Figure 3:
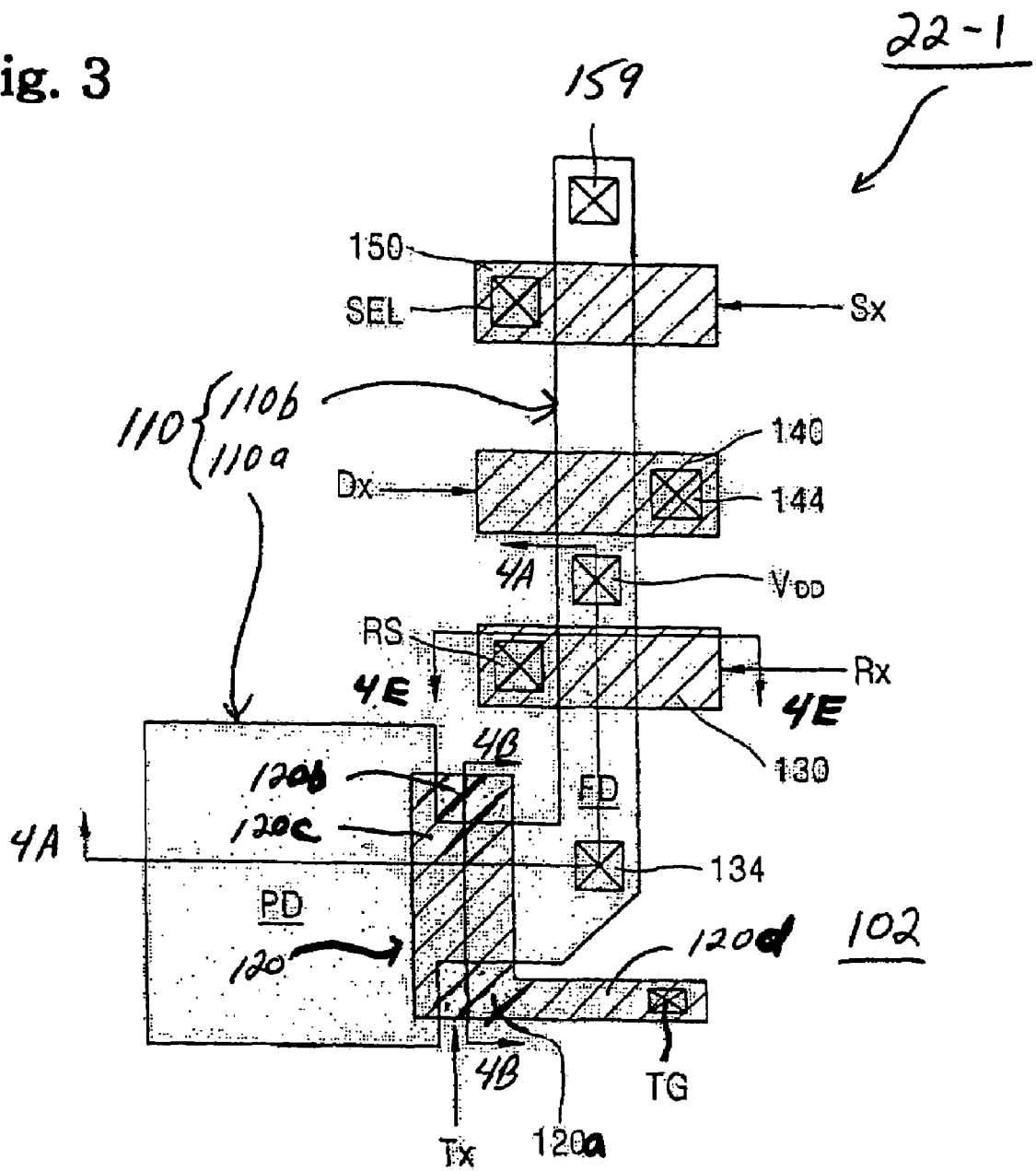
FIG. 3 is a plan view that schematically depicts a layout pattern of a unit pixel according to an exemplary embodiment of the invention.

FIG. 3 is a plan view that schematically depicts a layout pattern of a unit pixel (22-1) according to an exemplary embodiment of the invention. More specifically, FIG. 3 depicts an exemplary layout pattern of a unit pixel (22-1) having a 4-T active pixel sensor framework as depicted in FIG. 2. The exemplary unit pixel (22-1) comprises an active silicon region (110) and isolation region (102) formed on a semiconductor substrate. The active silicon region (110) is defined (surrounded) by the isolation region (102). In one exemplary embodiment, the isolation region (102) is formed using STI (shallow trench isolation) techniques. The active silicon region (110) comprises a PD (photodiode) region (110a) (or light receiving region) and a transistor active region (110b) (or transistor region). The exemplary embodiment of FIG. 3 depicts the PD region (110a) as being rectangular-shaped and the transistor active region (110b) as being linear-shaped with a bent portion that extends from a side of the PD region (110a). In other exemplary embodiments of the invention, the PD and transistor active regions (110a, 110b) may be formed having other shapes and configurations, as discussed later.

The unit pixel (22-1) comprises various gate electrodes formed at locations along the transistor active region (110b), including a gate electrode (120) (or transfer gate) of a transfer transistor TX, a gate electrode (130) (or reset gate) of a reset transistor RX, a gate electrode (140) of an amplifier transistor DX and a gate electrode (150) of a select transistor SX. The gate electrodes (120), (130), (140) and (150) are formed to overlap portions of the transistor active region (110b) and portions of the isolation region (102) adjacent thereto. Various contacts TG, RS, 144 and SEL are formed on portions of respective gate electrodes (120), (130), (140) and (150).

The transfer gate (120) is disposed between the PD region (110a) and a FD (floating diffusion) region of the transistor active region (110b). The transfer gate (120) comprises a plurality of gate electrodes (120a), (120b) and (120c) and an extended portion (102d). The contact TG is formed on the extended portion (120d) of the gate electrode 20) to provide a contact to a TG control signal line. The gate electrodes (120a) and (120b) are vertical gate electrodes which extend down into different regions of the isolation region (102) and which are disposed adjacent to sidewall surfaces of the active silicon region (110). As will be explained in further detail below, the sidewall surfaces of the active silicon region which are disposed adjacent to the vertical gate electrodes, include vertical channels that allow photo-generated charges to be readily transferred from the PD region to the FD region by operation of the transfer transistor TX.

The FD region is formed by doping the portion of the active transistor region (110b) between the transfer gate (120) and reset gate (130). The FD region provides a drain region for the transfer transistor TX and a source region for the reset transistor RX. The contact (134) formed on the FD region enables electrical connection between the FD region and the contact (144) formed on the gate electrode (140) of the amplifier transistor DX. The portion of the transistor active region (110b) between the gate electrodes (130) and (140) is doped to provide a drain region for both the reset transistor RX and the amplifier transistor DX, and has a contact VDD formed thereon to provide a VDD supply voltage connection. The contact RS formed on the reset gate (130) provides a contact to a reset gate control signal line. The portion of the transistor active region (110b) between the gate electrodes (140) and (150) is doped to provide a source region for the amplifier transistor DX and a drain region for the select transistor SX. The SEL contact formed on the gate electrode (150) provides a contact to a select gate control signal line. An output contact (159) is formed on a portion of the active transistor region (110b) that is doped to provide a source region for the select transistor SX. The output contact (159) provides a connection of the source region of the select transistor SX to an output line (bit column line).

Figure 4A:
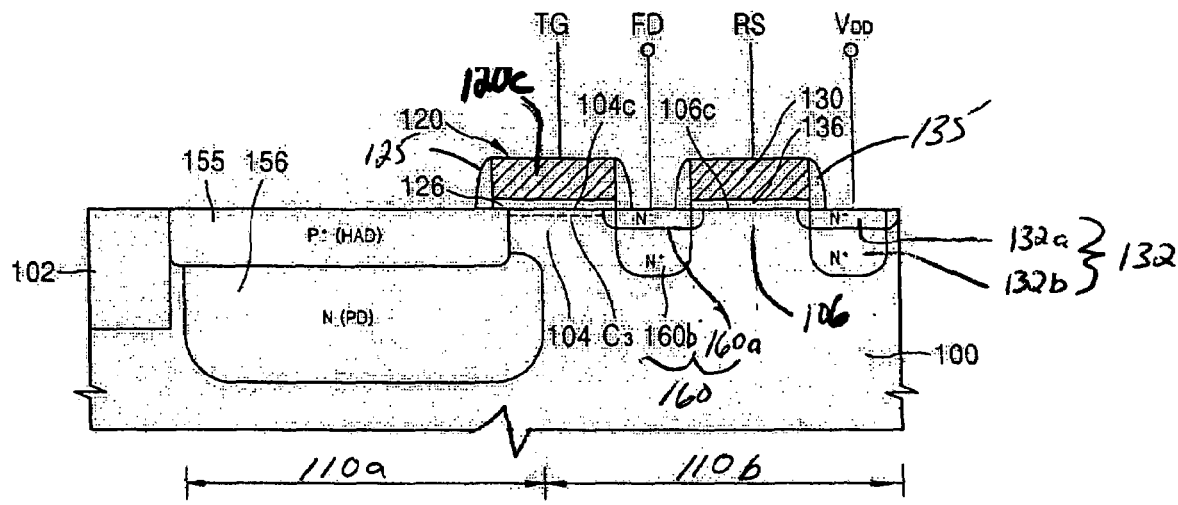
FIG. 4A is a schematic cross-sectional view of the unit pixel along line 4A-4A in FIG. 3, according to an exemplary embodiment of the invention.
Figure 4B:
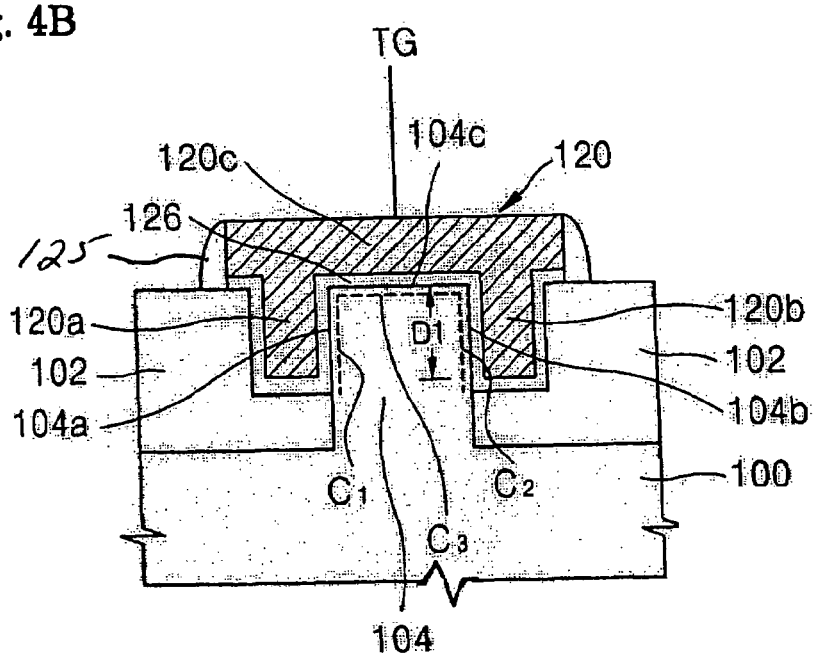
FIG. 4B is a schematic cross-sectional view of the unit pixel along line 4B-4B in FIG. 3, according to an exemplary embodiment of the invention.
Figure 4C:
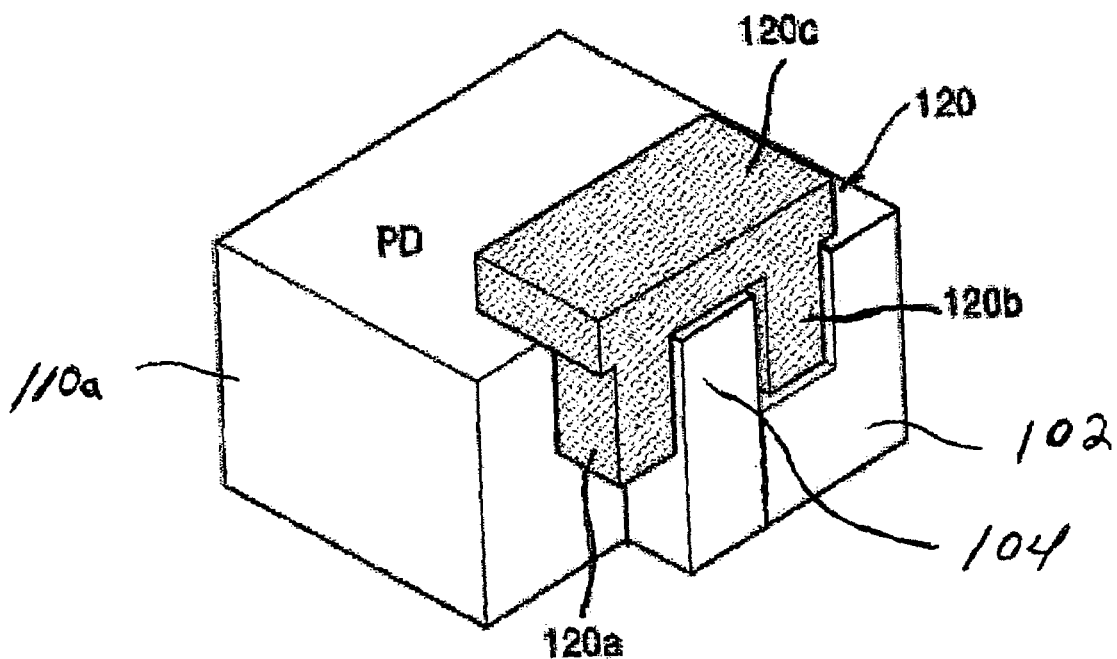
FIG. 4C is a schematic perspective view of a transfer gate structure of a unit pixel of FIG. 3, according to an exemplary embodiment of the invention.

FIGS. 4A~4C are schematic diagrams illustrating details of the exemplary unit pixel (22-1) of FIG. 3 according to exemplary embodiments of the invention. More specifically, FIG. 4A is a schematic cross-sectional view of the unit pixel (22-1) along line 4A-4A in FIG. 3, which illustrates the PD region (110a) and a portion of the transistor region (110b) including the transfer gate (120), FD region (160) and reset gate (130). Further, FIG. 4B is a schematic cross-sectional view of the unit pixel (22-1) along line 4B-4B of FIG. 3, which illustrates structural details of the exemplary transfer gate (120), and FIG. 4C is a schematic perspective view of the transfer gate (120) of the unit pixel (22-1).

Referring to FIG. 4A, the PD region (110a) comprises a light receiving element (or photodetector element) formed in a semiconductor substrate layer (100). In one exemplary embodiment, the substrate layer (100) is a p-doped layer (e.g., p-well or p-epitaxial layer) formed on a semiconductor substrate, in which the active pixel elements are formed. In the exemplary embodiment, the light receiving element formed in the PD region (110a) comprises a p+ layer (155) (or HAD (hole accumulation diode) layer) and a buried n-well layer (156) formed below the p+ layer (155) The stacked p+/n/p layers (155)/(156)/(100) of the PD region (110a) form a pinned photodiode device, as is known in the art. Pinned photodiodes are typically implemented in active pixel sensor designs because of various advantages afforded by such devices.

For example, a pinned photodiode device can be formed such that the voltage of the device does not exceed a pinning voltage, VP, when the device is fully depleted (i.e., when the depletion regions of both p/n junctions meet). The pinned photodiode can be designed such that the pinning voltage VP is lower than the voltage of the FD region (160) upon reset, to thereby allow complete charge transfer from the PD region (110a) to the FD region (160). Another advantage of using a pinned diode device is that the p+ layer (155) provides a reduced dark current (as compared to conventional photodiodes) by separating the buried n-well layer (156) from the silicon surface. Indeed, the p+ layer (155) causes photo-generated charges in the PD region (110a) to be accumulated and confined in the buried n-well layer (156). As such, the p+ layer (155) effectively shields the n-well (156) from thermally generated charges at the active silicon surface, resulting in a reduction of dark current and corresponding noise elements. Moreover, the p+ layer (156) operates to increase the spectral response of the pixel by capturing short-wavelength visible light (blue light) in the junction between the p+ and n-well layers, while the deeper p/n-well junction can capture of longer wavelengths of light (red and infrared).

As further depicted in FIG. 4A, the transfer transistor TX comprises the gate electrode (120) with sidewall spacers (125) and a gate insulation layer (126) formed between the substrate (100) and the gate electrode (120). The reset transistor RX comprises the gate electrode (130) with sidewall spacers (135) and a gate insulation layer (136) formed between the substrate (100) and the gate electrode (130). The FD region (160) comprises a lightly n-doped layer (160a) and a heavily n-doped layer (160b), formed in the active region of the substrate layer (100) between the transfer and reset gates (120) and (130). A noted above, the FD region (160) comprises a source region for the reset transistor RX and a drain region of the transfer transistor TX. A drain region of the reset transistor RX is an n-doped diffusion region (132), which comprises lightly n-doped diffusion region (132a) and a heavily n-doped diffusion region (132b). The drain region (132) is connected to supply voltage VDD.

Referring to FIGS. 4B and 4C, the transfer gate (120) comprises vertical gate electrodes (120a) and (120b) and a horizontal gate electrode (120c). The vertical gate electrodes (120a) and (120b) are connected to, and extend, from the horizontal electrode (120c) into the isolation region (102) to a depth D1 below the surface of the substrate layer (100). The portion of the active silicon region (110b) that is covered/wrapped by the gate electrodes (120a, 120b, 120c) forms a mesa-type channel region (104) having vertical sidewalls (104a) and (104b) and upper surface (104c). An insulation layer (126) is formed between the gate electrodes (120a, 120b, 120c) and the substrate (100) and isolation (102) layers. The channel region (104) comprises a plurality of channels for transferring accumulated charges from the PD region (110a) to the FD region (160) when a control voltage is applied to the transfer gate (120). The channels include vertical channels C1 and C2 in the active silicon region along the vertical sidewalls (104a) and (104b), respectively, and a horizontal channel C3 in the active silicon region along the upper surface (104c).

It is to be appreciated that as compared to conventional designs, the exemplary transfer gate (120) architecture having vertical gate electrodes (120a, 120b) enables photo-generated charges accumulated in the PD region (110a) to be more effectively transferred to the FD region (160) in a manner that minimizes or prevents image lag. Indeed, with conventional pixel designs, transfer gate electrodes typically consist of stacked gate structures formed on the active silicon surface. With such conventional designs, however, as the distance between the channel region of the transfer gate and the charge accumulation region of the PD element increases, it becomes more difficult to transfer photo-generated charges to the FD region, resulting in image lag.

For example, FIG. 4A illustrates the horizontal gate electrode (120c) and surface channel C3, wherein C3 is separated from the n-well layer (156) (charge accumulation region) of the pinned diode element. With conventional transfer gates that only consist of a stacked gate structure (gate electrode (120c) and gate oxide (126)), image lag may occur with increased distance between the n-well layer (156) (the charge accumulation region) and the surface channel C3. Indeed, as CMOS image sensor devices become more highly integrated (e.g., smaller pixel area) and are designed to operate with lower supply voltages, the lengths of the transfer gate electrodes must be decreased and the vertical depths of the photodetector element must be increased. In such instance, the increased distance between the surface channel C3 and the n-well region (156), and the reduced voltage (decreased potential), would render the channel C3 ineffective to transfer charge from the deep n-well region (156) (or charge accumulation region of other types of photodetector elements) to the FD region (160), resulting in increased occurrences of image lag.

In accordance with the exemplary embodiment of FIGS. 4A~4C, the combination of the vertical and horizontal gate electrodes (120a, 120b and 120c) of the transfer gate (120) effectively increases the width of the transfer gate, while allowing smaller design rule designs. Moreover, the channel region (104) of the transfer gate (120) includes vertical channels C1, C2 as well as horizontal channel C3, for transferring accumulated charges from the n-well layer (156) to the FD region (160). Preferably, the vertical channels C1 and C2 are formed to a vertical depth D1 so as to be disposed adjacent to at least a portion of the n-well region (156). In one exemplary embodiment, the STI region (102) is formed to a depth of about 0.4 microns and D1 is less than 0.4 microns. More specifically, in one exemplary embodiment, the vertical gate electrodes (120a) and (120b) are formed to a depth D1 which is about the depth of the center of the buried n-well layer (156). As such, the vertical channels C1 and C2 effectively decrease the physical gap between the n-well region (156) and the surface channel C3 to enable more effective charge transfer and reduce or eliminate image lag.

Figure 4D:
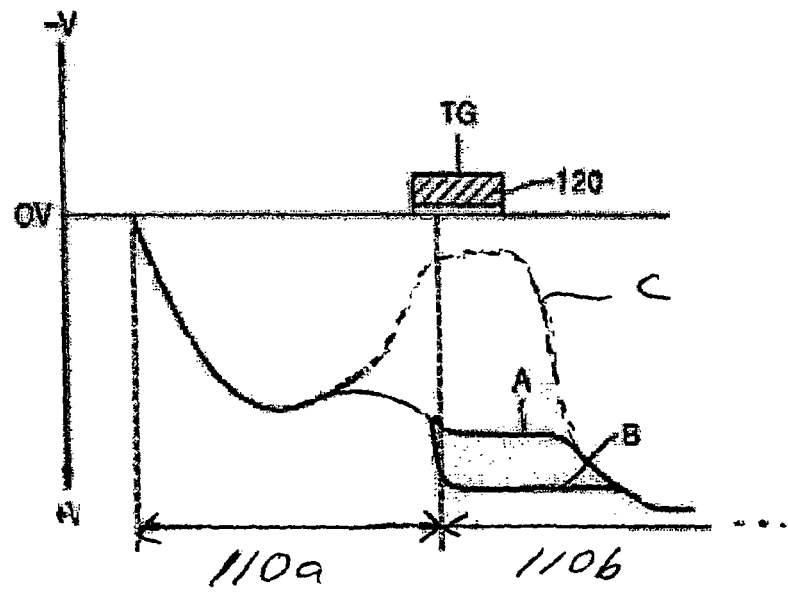
FIG. 4D graphically illustrates a potential level in an active region of the unit pixel near the transfer gate of the exemplary unit pixel of FIG. 3.

FIG. 4D graphically illustrates a potential level of the PD region (110a) and the transistor region (110b) in proximity to the transfer gate (120) for the exemplary unit pixel (22-1). Curve A represents the potential level of the PD region (110a) and a potential level of the surface channel C3 of the transfer gate (120) when the transfer transistor TX is "ON". Curve B illustrates a potential level of the PD region (110a) and vertical channels C1 and C2 of the transfer gate (120) when the transfer transistor TX is "ON". Curve C illustrates the potential level of the PD region (110a) and the channels of the transfer gate (120) when the transfer transistor TX is "OFF". When the transfer gate (120) is "ON" or "OFF", the potential barrier changes in the region under the transfer gate (120). As is apparent from FIG. 4D, the vertical channels C1 and C2 are lower than the surface channel C3 so the electrons in the PD region (110a) can be easily transferred to the FD region (160) without image lag.

In addition, as compared to conventional designs, the use of the transfer gate (120) with vertical gate electrodes (120a) and (120b) allows the n-well region (156) of the pinned photodiode to be located deeper within the substrate (100) away from the substrate surface, which leads to a further reduction or elimination of the dark current noise.

Figure 4E:
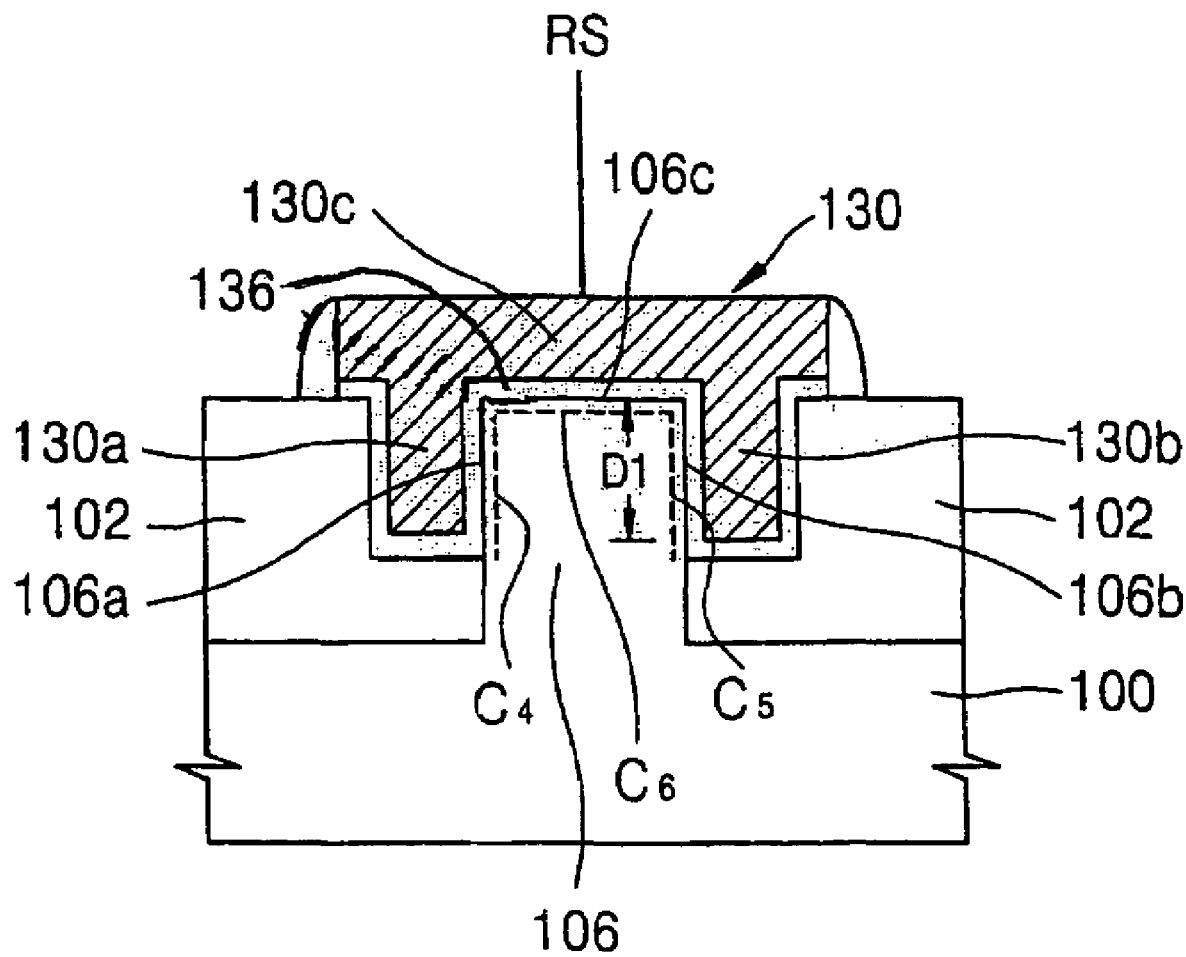
FIG. 4E is a schematic cross-sectional view of the unit pixel along line 4E-4E in FIG. 3, according to an exemplary embodiment of the invention.

In another exemplary embodiment of the invention, the gate electrode (130) of the reset transistor RX in FIGS. 3 and 4A can be designed to have a structure similar to the gate electrode (120) of the transfer transistor TX. For example, FIG. 4E is a cross-sectional view along line 4E-4E of FIG. 3, which illustrates a structure of the reset gate electrode (130) according to an exemplary embodiment of the invention. The reset gate electrode (130) comprises vertical gate electrodes (130a) and (130b) and horizontal gate electrode (130c). The vertical gate electrodes (130a) and (130b) are connected to, and extend, from the horizontal gate electrode (130c) into the isolation region (102) to a depth D1 below the surface of the substrate layer (100). The portion of the active silicon region (110b) that is covered/wrapped by the gate electrodes (130a, 130b, 130c) forms a mesa-type channel region (106) having vertical sidewalls (106a) and (106b) and an upper surface (106c). An insulation layer (136) is formed between the gate electrodes (130a, 130b, 130c) and the substrate (100) and isolation (102) layers. The channel region (106) comprises a plurality of channels, including vertical channels C4 and C5 in the region of the active silicon along vertical sidewalls (106a) and (106b), respectively, and a horizontal surface channel C6 in the active silicon along the upper surface (106c).

The exemplary reset gate (130) structure with vertical gate electrodes (106a) and (106b) enables more effective discharging of the FD region upon reset to protect against image lag that can occur as a result of incomplete reset of the FD region to a desired reference voltage level. Indeed, as pixels are designed with decreased design rules and low supply voltages, the reset gate (130) with vertical gate electrodes (130a) and (130b) provides an effective increase in gate width allowing for efficient charge transfer despite small potential differences between the FD region and supply voltage.

Figure 5A:
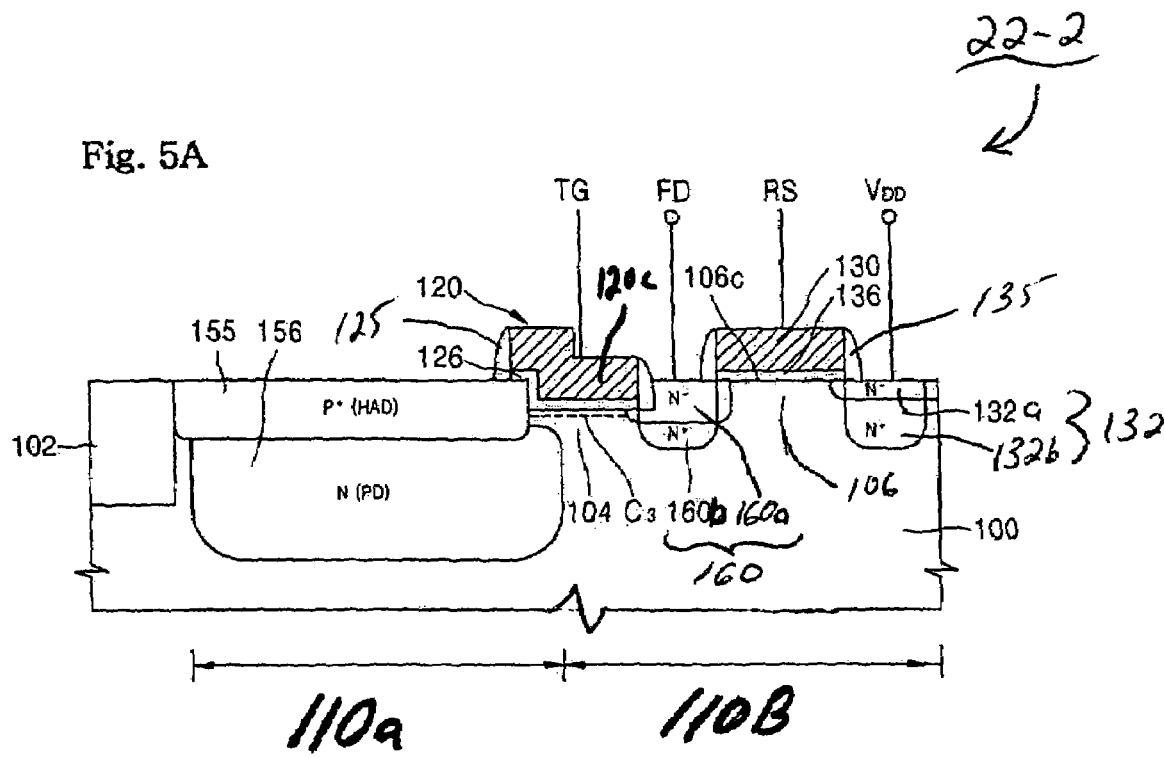
FIGS. 5A, 5B and 5C schematically illustrate a unit pixel architecture according to another exemplary embodiment of the invention.
Figure 5B:
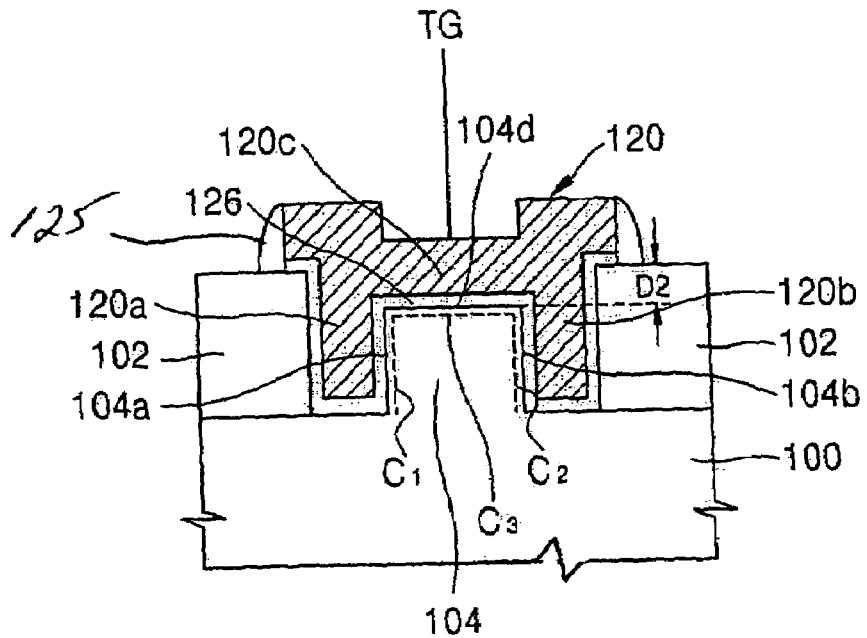
Figure 5C:
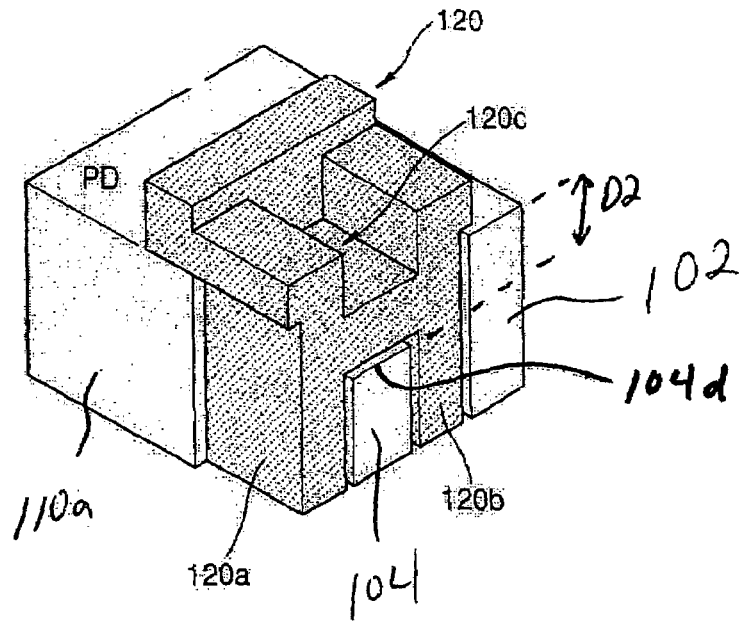

FIGS. 5A~5C schematically illustrate a unit pixel (22-2) architecture according to another exemplary embodiment of the invention. For illustrative purposes, it is assumed that the exemplary unit pixel (22-2) has a layout pattern similar to the layout pattern of the exemplary unit pixel (22-1) as depicted in FIG. 3. In this regard, FIG. 5A is a cross-sectional view similar to that of FIG. 4A, FIG. 5B is a cross-sectional view similar to that of FIG. 4B, and FIG. 5C is a perspective view similar to that of FIG. 4C. In general, the exemplary unit pixel (22-2) of FIGS. 5A~5C is similar to the pixel unit (22-1) of Figures. FIGS. 4A~4C, except that the horizontal gate electrode electrode (120c) of the transfer gate (120) is partially recessed into the substrate layer (100).

More specifically, referring to FIGS. 5B and 5C, the channel region (104) wrapped by the transfer gate electrodes (104a), (104b) and (104c) has an upper surface (104d) that is recessed to a depth D2 below the surface of the substrate (100) (as compared to the unit pixel (22-1) where the upper surface (104c) of the channel region (104) is at the same level as the surface of the substrate (100)). As depicted in FIG. 5A, the exemplary embodiment enables the surface channel C3 to be closer to the buried n-well layer (156) (as compared to FIG. 4A), which increases the ability to transfer charges from the PD region (110a) to the FD region (160). As further depicted in FIG. 5A, the spacer that is formed on the sidewall of the horizontal gate electrode (120c) adjacent the FD region (160) is also recessed below the surface of the substrate (100) to electrically isolate the gate electrode (120) from the FD region (160).

Figure 6:
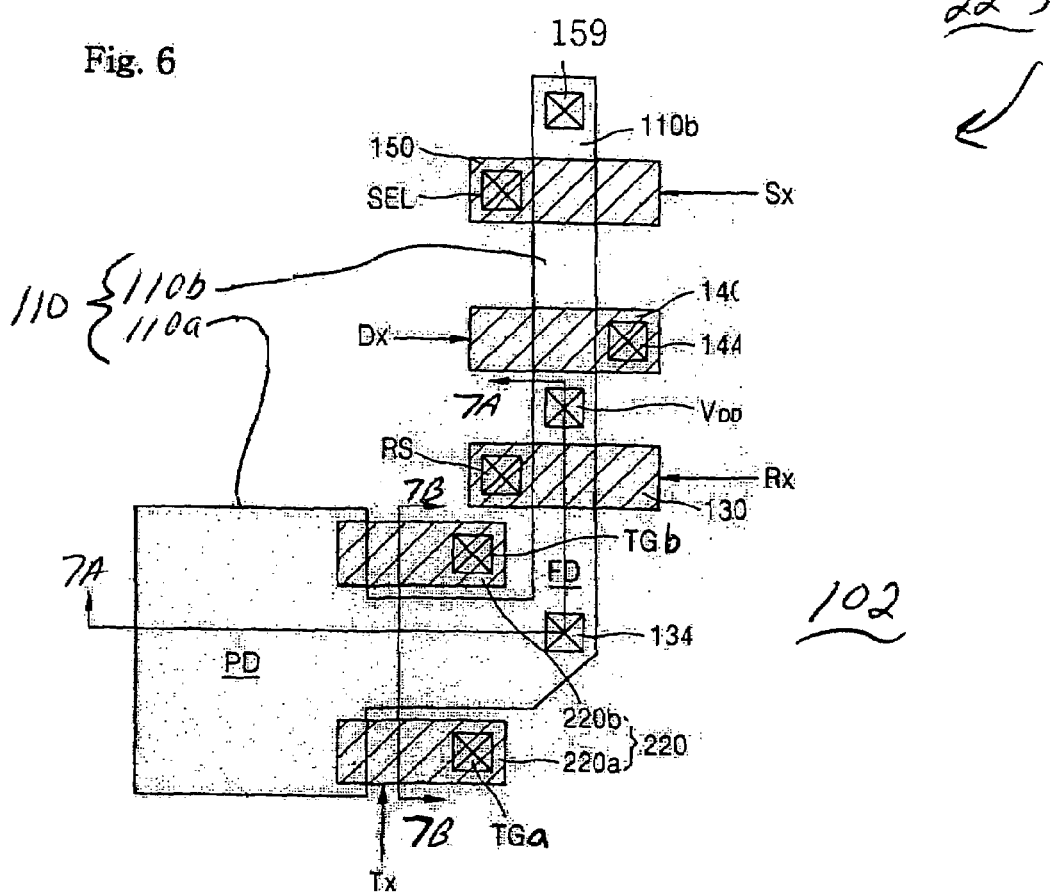
FIG. 6 is a plan view that schematically depicts a layout pattern of a unit pixel according to another exemplary embodiment of the invention.

FIG. 6 is a plan view that schematically depicts a layout pattern of a unit pixel (22-3) according to another exemplary embodiment of the invention. More specifically, FIG. 6 depicts an exemplary layout pattern for a unit pixel unit (22-3) according to an exemplary embodiment having a 4-T active pixel sensor framework as depicted in FIG. 2. The layout pattern of the exemplary unit pixel (22-3) is similar to the exemplary layout pattern of the unit pixel (22-1) of FIG. 3 and thus, a detailed discussion is not necessary. The exemplary unit pixel (22-3) comprises a transfer gate (220) that is formed of separate vertical gate electrodes (220a) and (220b) having respective gate contacts TGa and TGb, disposed on opposite sides of the active transistor region (110b) adjacent the PD region (110a). The structure of the exemplary transfer gate (220) is further depicted in the exemplary embodiments of FIGS. 7A~7C.

Figure 7A:
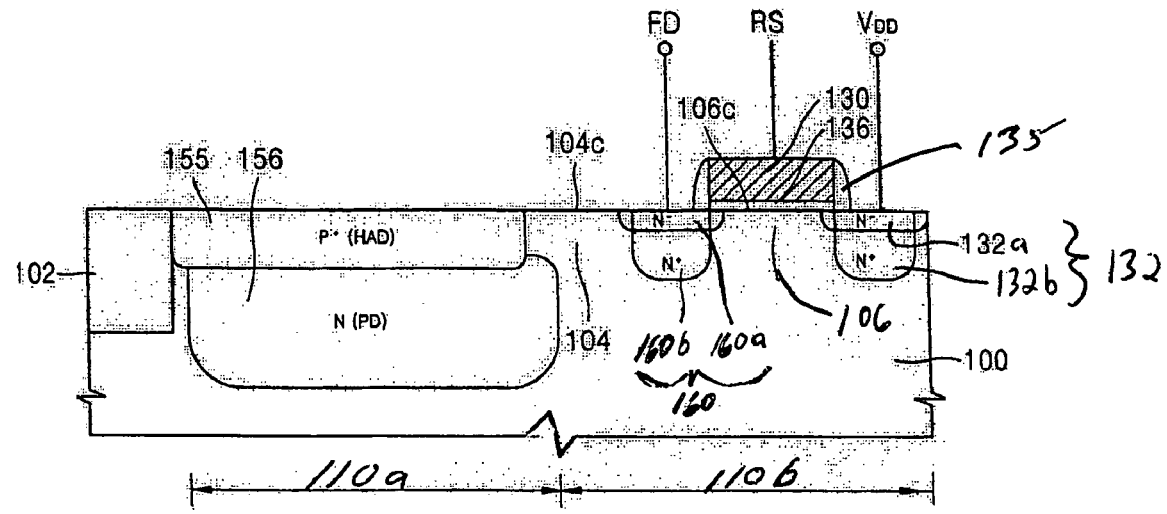
FIG. 7A is a schematic cross-sectional view of the unit pixel along line 7A-7A in FIG. 6, according to an exemplary embodiment of the invention.
Figure 7B:
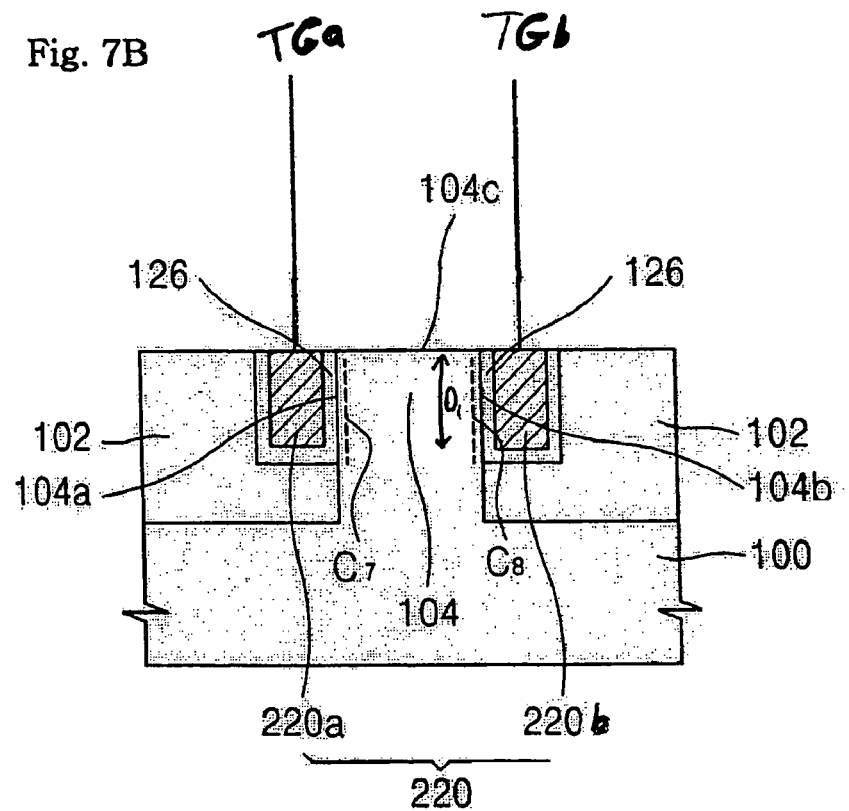
FIG. 7B is a schematic cross-sectional view of the unit pixel along line 7B-7B in FIG. 6, according to an exemplary embodiment of the invention.
Figure 7C:
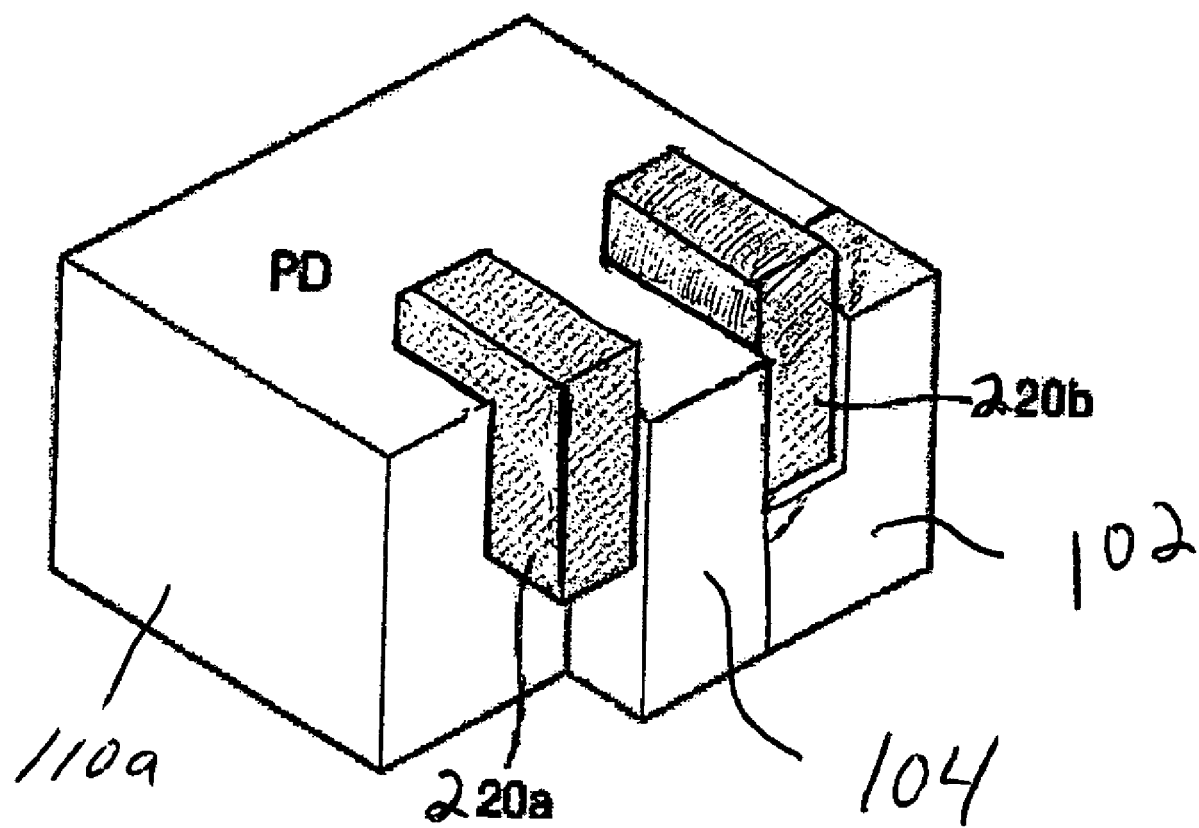
FIG. 7C is a schematic perspective view of a transfer gate structure of a unit pixel of FIG. 6, according to an exemplary embodiment of the invention.

More specifically, FIGS. 7A~7C are schematic views illustrating further details of the exemplary unit pixel (22-3) of FIG. 6, wherein FIG. 7A is a schematic cross-sectional view of the unit pixel (22-3) along line 7A-7A in FIG. 6, FIG. 7B is a cross-sectional view of the unit pixel (22-3) along line 7B-7B of FIG. 6, and wherein FIG. 7C is a schematic perspective view of the transfer gate (220). As illustrated in FIGS. 7A~7C, the transfer gate (220) comprises separate vertical gate electrodes (220a) and (220b) that are formed to a depth D1 below the surface of the substrate (100) and adjacent to respective sidewalls (104a) and (104b) of the channel region (104). The channel region (104) includes deep vertical channels C7 and C8 that are disposed in proximity to the buried n-well layer (156) for effectively transferring accumulated charges from the PD region (110a) to the FD region (160).

As compared with the exemplary transfer gates (120) of pixels units (22-1) and (22-2) as discussed above, the transfer gate (220) of pixel unit (22-3) does not include a horizontal gate electrode formed on top of the substrate (100) over the active silicon channel region (104). Depending on the application, the exemplary transfer gate (200) structure with vertical gate electrodes (220a) and (220b) can effectively minimize or eliminate image lag, while reducing dark current noise that may result from surface defects on the upper surface of the active silicon channel region (104) when the horizontal gate electrode and channel are implemented. In addition, elimination of the horizontal gate electrode can increase the efficiency or "fill factor" of the pixel unit by reducing the shadow effect caused by an upper horizontal gate structure and allowing an increase in the angle of incident light that can reach the PD region (110a).

Figure 8:
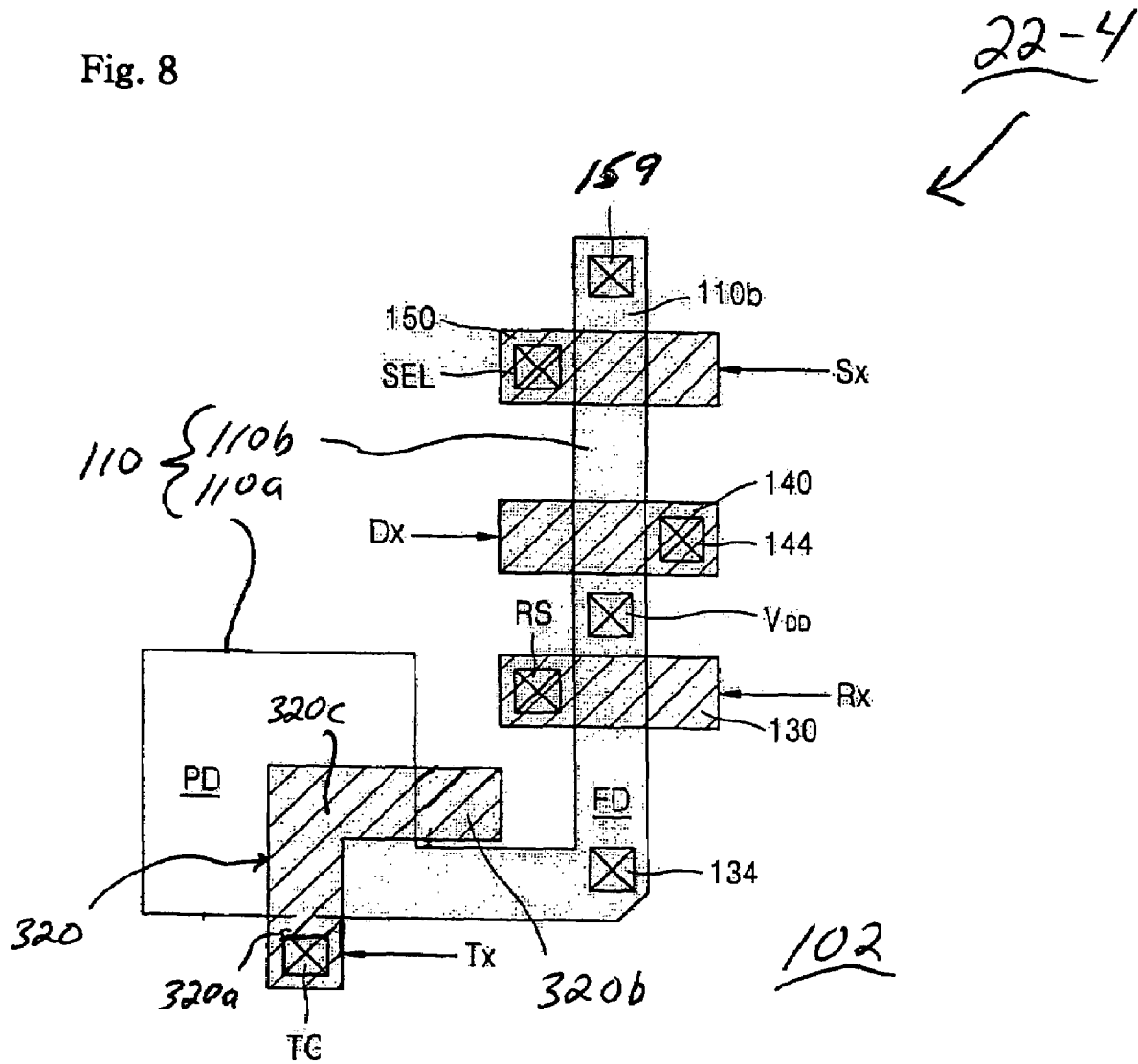
FIG. 8 is a plan view that schematically depicts a layout pattern of a unit pixel according to another exemplary embodiment of the invention.

FIG. 8 is a plan view that schematically depicts a layout pattern of a unit pixel (22-4) according to another exemplary embodiment of the invention. More specifically, FIG. 8 depicts an exemplary layout pattern of a unit pixel unit (22-4) according to an exemplary embodiment having a 4-T active pixel sensor framework as depicted in FIG. 2. The layout pattern of the exemplary unit pixel (22-4) as depicted in FIG. 8 is essentially similar to the exemplary layout patterns of the unit pixels described above, except that the exemplary unit pixel (22-4) comprises an L-shaped transfer gate (320) that is formed over the hole accumulation layer (155) in the PD region (110a). As is known in the art, conventional L-shaped transfer gates are stacked gate structures that are formed on the substrate surface over the PD region to increase the charge transfer efficiency for transferring accumulated charges from the PD region (110a) to the FD region (160).

In accordance with an exemplary embodiment of the invention, in contrast to conventional designs, the L-shaped transfer gate (320) comprises vertical gate electrodes (320a) and (320b) in addition to horizontal gate electrode (320c). As with the vertical gate electrodes of the exemplary transfer gates (120) and (220) discussed above, the vertical gate electrodes (320a) and (320b) of the L-shaped gate electrode (320) are connected to, and extend from, the horizontal gate electrode (320c) into the isolation layer (102) and are disposed adjacent to sidewalls of the active silicon region. As discussed above, the vertical gate electrodes (320a) and (320b) enable formation of vertical channels in the active silicon sidewall regions adjacent to the vertical gate electrodes, to thereby increase the charge transfer efficient for transferring photo-generated charges from the PD region (110a) to the FD region (160).

Figure 9:
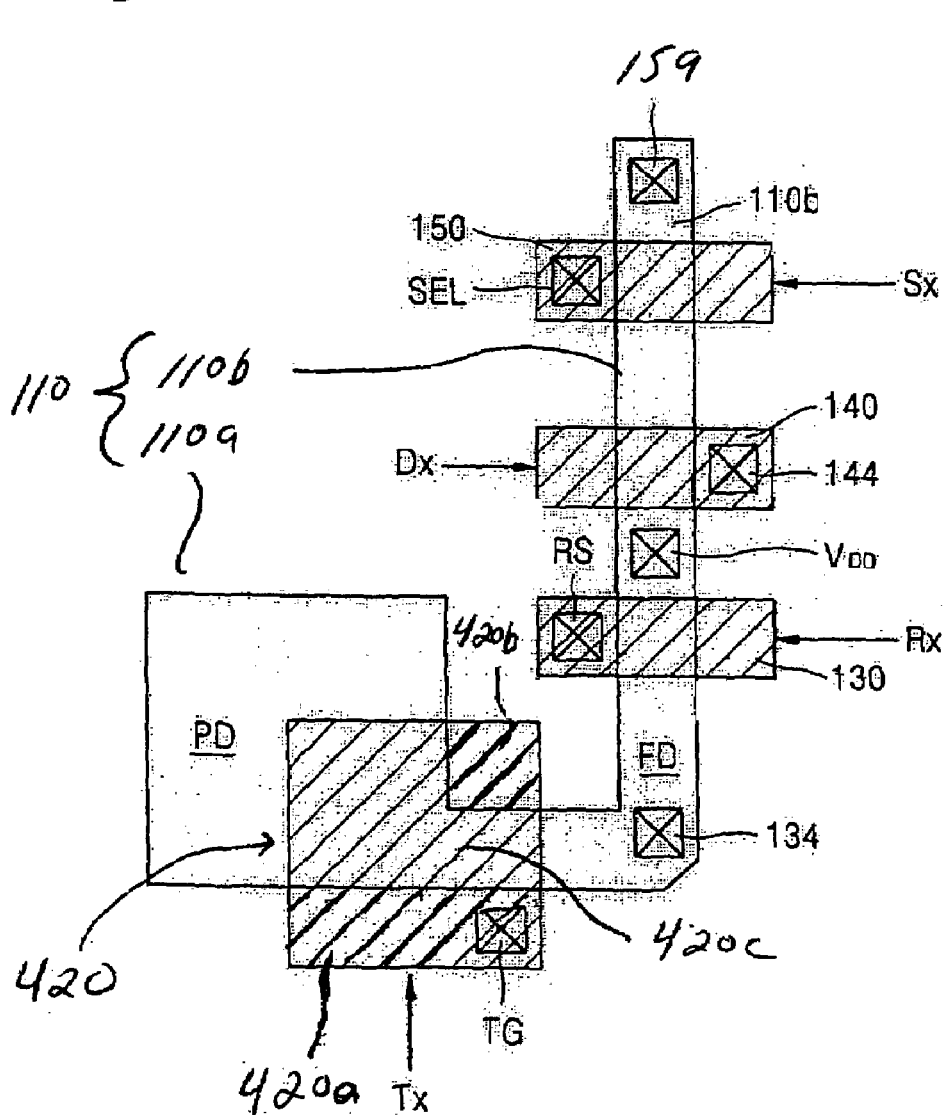
FIG. 9 is a plan view that schematically depicts a layout pattern of a unit pixel according to another exemplary embodiment of the invention.

FIG. 9 is a plan view that schematically depicts a layout pattern of a unit pixel (22-5) according to another exemplary embodiment of the invention. More specifically, FIG. 9 depicts an exemplary layout pattern for a unit pixel unit (22-5) according to an exemplary embodiment having a 4-T active pixel sensor framework as depicted in FIG. 2. The layout pattern of the exemplary unit pixel (22-5) as depicted in FIG. 9 is essentially similar to the exemplary layout patterns of the unit pixels described above, except that the exemplary unit pixel (22-5) comprises a rectangular-shaped transfer gate (420) that is formed over a portion of the hole accumulation layer (155) in the PD region (110a) and extends over the active silicon region (110b). As with the L-shaped transfer gate (320) discussed above, the rectangular transfer gate (420) increases the ability to transfer electrons from the PD region (110a) to the FD region (160).

In accordance with an exemplary embodiment of the invention, in contrast to conventional designs, the rectangular-shaped transfer gate (420) comprises vertical gate electrodes (420a) and (420b) in addition to a horizontal gate electrode (420c). As with the vertical gate electrodes of the exemplary transfer gates (120), (220) and (320) as discussed above, the vertical gate electrodes (420a) and (420b) of the rectangular-shaped gate electrode (420) are connected to, and extend from, the horizontal gate electrode (320c) into the isolation layer (102) and are disposed adjacent to sidewalls of the active silicon. As discussed above, the vertical gate electrodes (420a) and (420b) enable formation of vertical channels in the active silicon region adjacent the vertical gate electrodes to increase the ability to transfer electrons from the PD region (110a) to the FD region.

Figure 10:
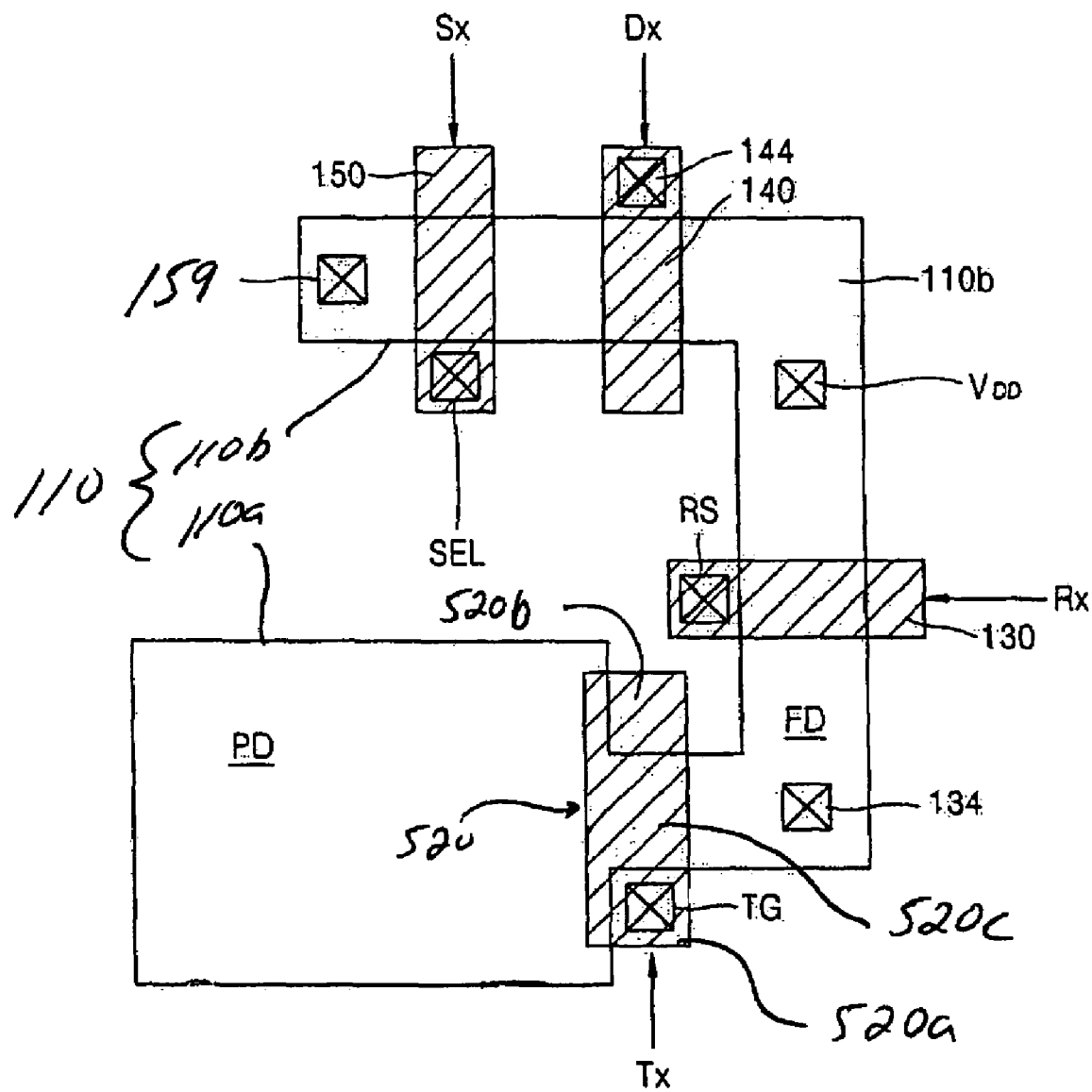
FIG. 10 is a plan view that schematically depicts a layout pattern of a unit pixel according to another exemplary embodiment of the invention.

FIG. 10 is a plan view that schematically depicts a layout pattern of a unit pixel (22-6) according to another exemplary embodiment of the invention. More specifically, FIG. 10 depicts an exemplary layout pattern for a unit pixel unit (22-6) according to an exemplary embodiment having a 4-T active pixel sensor framework as depicted in FIG. 2. The layout pattern of the exemplary unit pixel (22-6) as depicted in FIG. 10 is similar to the exemplary layout patterns of the unit pixels described above, except that the exemplary unit pixel (22-6) has an active region (110) and transfer gate (520) that are shaped/structured to provide a more compact layout area. For example, as compared to the exemplary layout pattern of the pixel unit (22-1) in FIG. 3, the active silicon region (110b) between the transistors RX and DX is bent to provide a compact active area layout. In addition, the unit pixel (22-6) comprises a transfer gate (520) having vertical gate electrodes (520a) and (520b) and a horizontal gate electrode (520c). The exemplary transfer gate (520) is similar in structure as the exemplary transfer gate (120) in FIG. 3, for example, except that the transfer gate (520) does not include an extended portion (102d) as the transfer gate (120) in FIG. 3, thus providing a reduction in the required layout area for the transfer gate.

FIGS. 11A-B~18A-B are diagrams that illustrate a method for manufacturing an image sensor device according to an exemplary embodiment of the invention. More specifically, FIGS. 11A-B~18A-B illustrate a method for fabricating an image sensor device having the exemplary unit pixel architecture (22-1) discussed above with reference to FIGS. 4A-4D, for example. In this regard, FIGS. 11A~18A illustrate various fabrication stages of the exemplary pixel unit (22-1) from the viewpoint of FIG. 4A and FIGS. 11B~18B illustrate the various fabrication stages of the exemplary pixel unit (22-1) from the viewpoint of FIG. 4B.

Figure 11A:
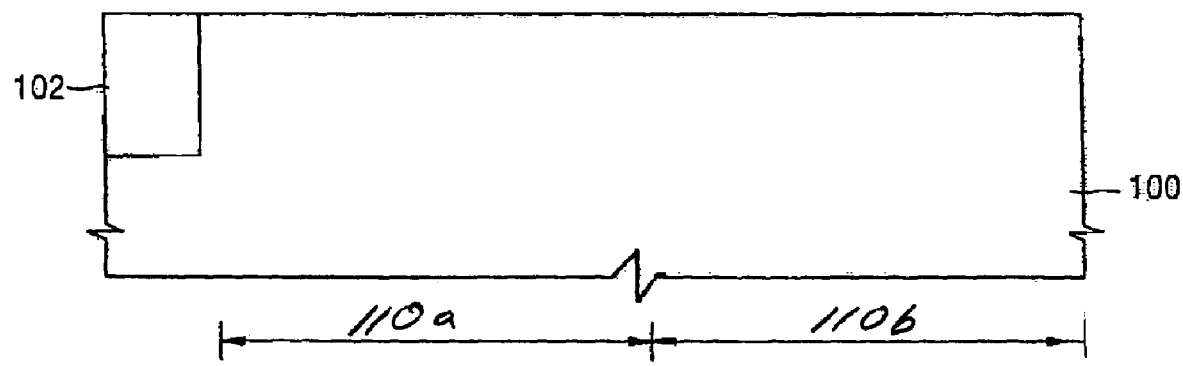
FIGS. 11A-B through 18A-B are diagrams that illustrate a method for manufacturing an image sensor device according to an exemplary embodiment of the invention.
Figure 11B:
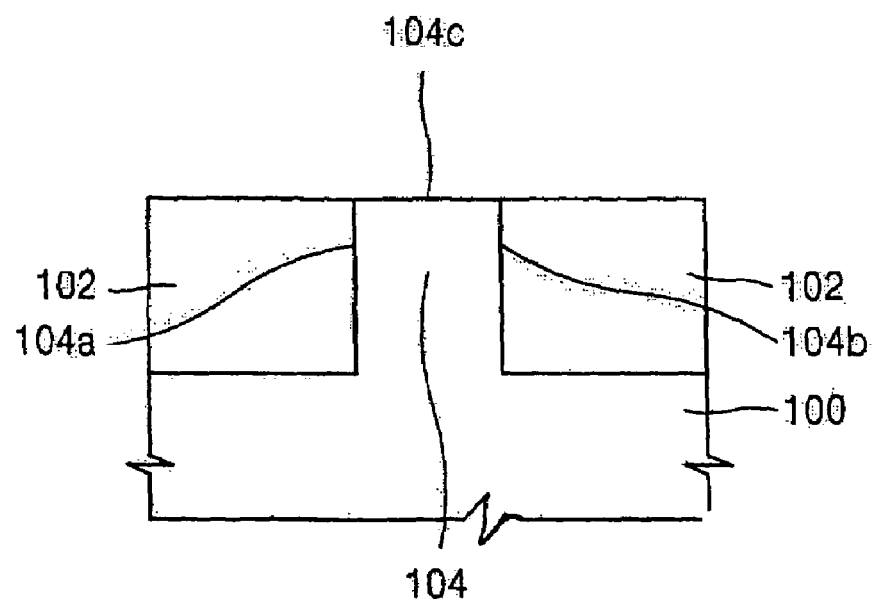
Figure 12A:
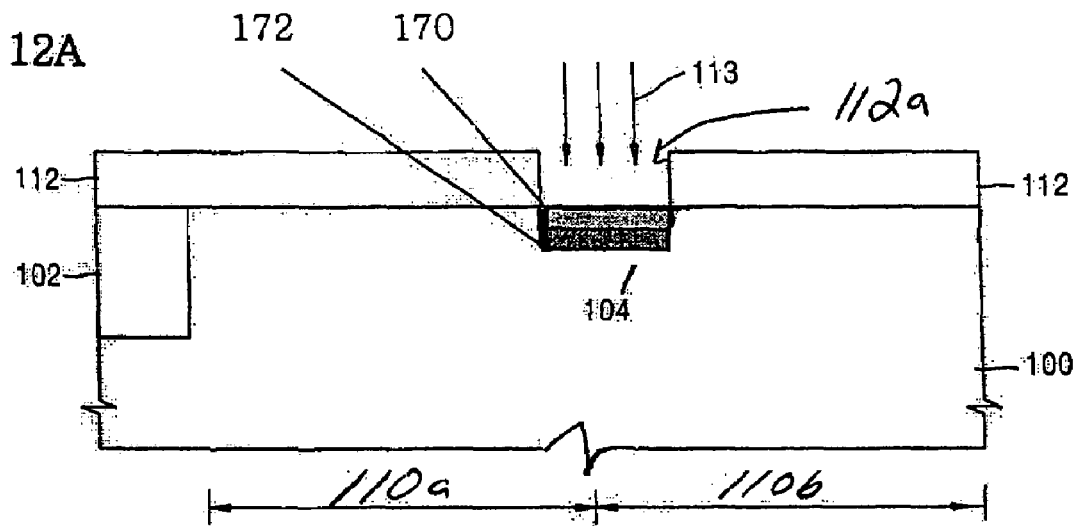
Figure 12B:
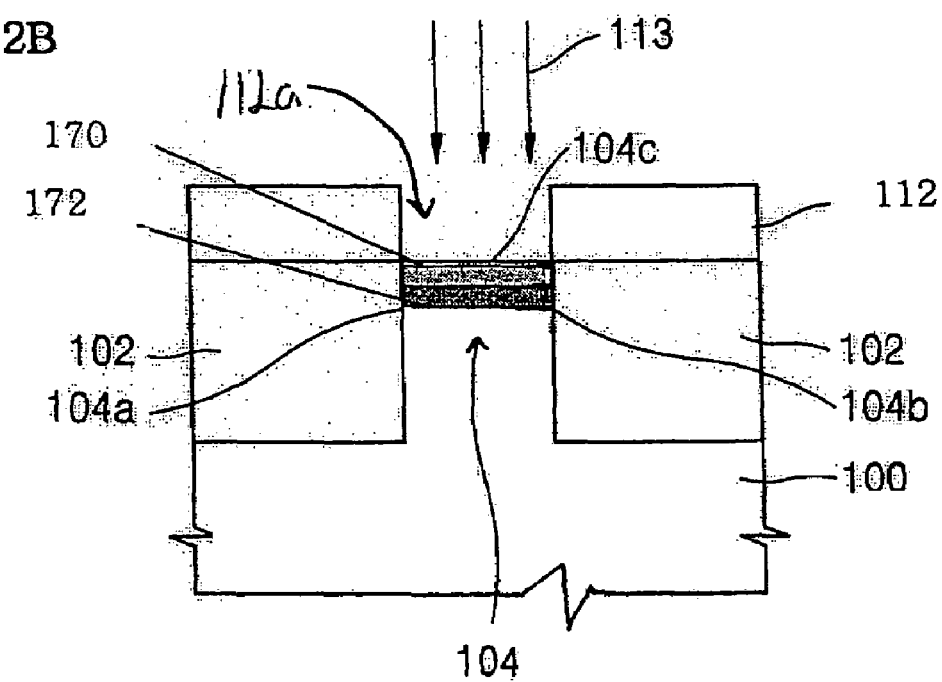

Referring to FIGS. 11A and 11B, an initial step of the exemplary manufacturing process comprises forming the isolation region (102) in the semiconductor substrate (100) to define the active silicon region for the pixels. In one exemplary embodiment, the semiconductor substrate layer (100) is a p-doped layer formed on a semiconductor substrate. The isolation region (102) can be formed of any suitable insulation material such as silicon dioxide, using known methods such as shallow trench isolation (STI) or local oxidation of silicon (LOCOS) methods. As depicted in FIG. 11B, the channel region (104) comprises a mesa-type structure having vertical sidewalls (104a) and (104b) and upper surface (104c), which is defined by the surrounding isolation region (102). Referring to FIGS. 12A and 12B, a photoresist pattern (112) is formed over the substrate (100) using a conventional photolithography method. The photoresist pattern (112) is formed having an opening (112a) that defines and exposes the channel region (104) of the transfer transistor TX. Various ion implantation methods (113) are performed to implant dopants into the surface (104c) of the channel region (104) to form doped layers (170) and (172). More specifically, in one exemplary embodiment, n-type dopants (such as phosphorus) are implanted into the exposed surface (104c) of channel region (104) with a first ion implantation energy to form a buried channel layer (172) for the transfer transistor. The n-doped buried channel layer (172) is formed to define the depletion characteristics of the transfer transistor TX and to reduce what is known as the blooming phenomenon.

In addition, p-type dopants (such as Boron) are implanted into the exposed surface (104c) of the channel region (104) at a second ion implantation energy to form a p-type layer (170) just below the surface (104c) and above the buried channel layer (172). The p-type layer (170) is formed as a means of reducing dark current noise by shielding the buried channel layer (172) from thermally generated electrons in the surface (104c) of the channel region (104). The p-doped layer (170) can be formed of enhanced conductivity relative to that of the substrate layer (100) so that the surface region will be accumulated with holes that can absorb dark current generated in the upper surface the transfer gate.

Figure 13A:
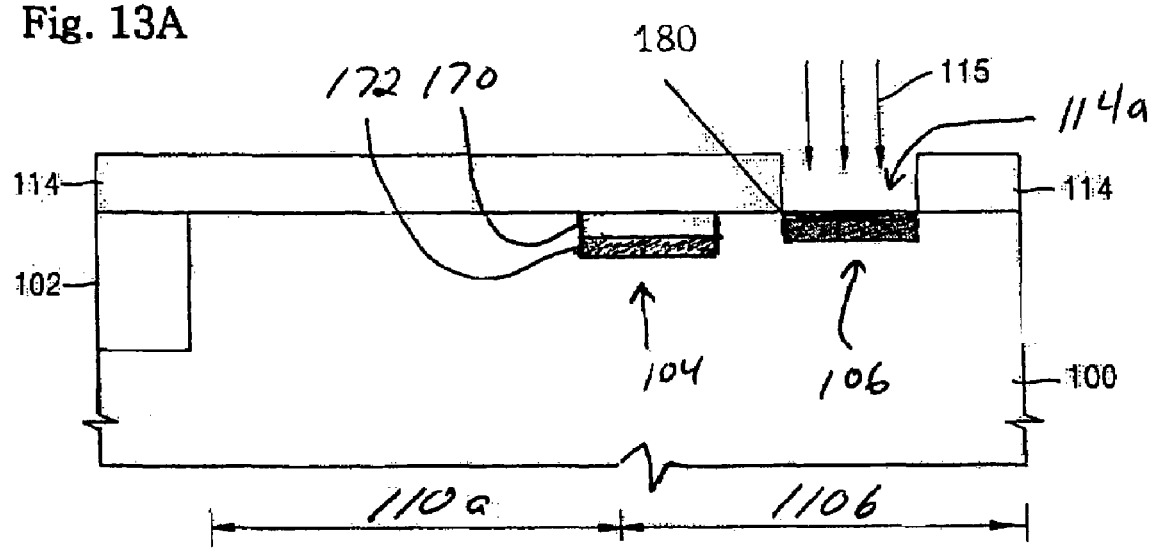
Figure 13B:
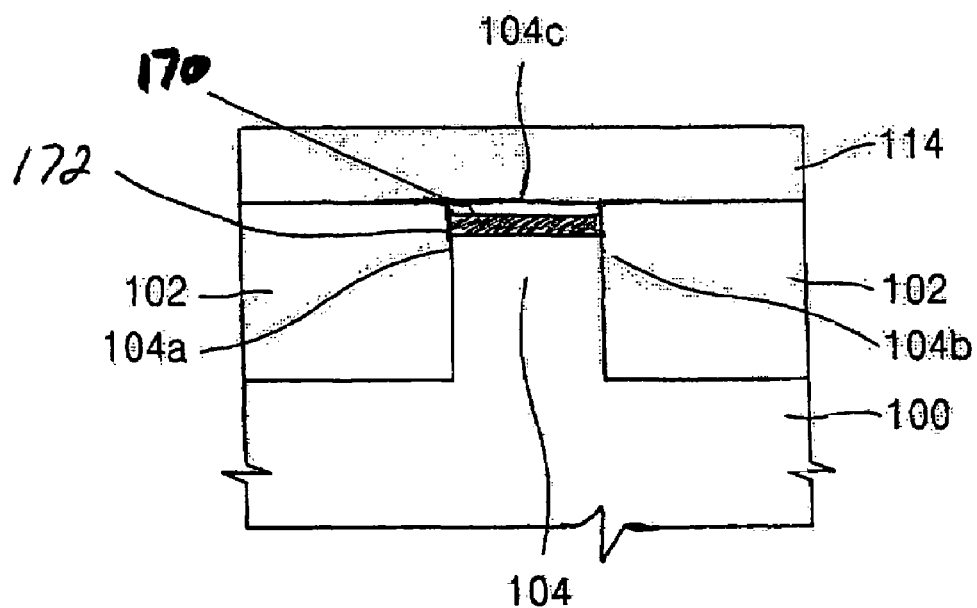

Referring to FIGS. 13A and 13B, the first photoresist pattern (112) is removed using conventional methods, and a second photoresist pattern (114) is formed over the substrate (100) having an opening (114a) that defines and exposes the channel region (106) of the reset transistor RX. In one exemplary embodiment, an ion implantation method (115) is performed to implant n-type dopants (such as phosphorus) into the exposed surface of the channel region (106) with a first ion implantation energy to form a buried channel layer (180) for the reset transistor RX. The n-type buried channel layer (180) is formed to define the depletion characteristics of the reset transistor RX and reduces the blooming phenomenon. As depicted in FIG. 13B, the photoresist pattern (114) protects the channel region (104) of the transfer transistor TX during the ion implantation (115) process.

Figure 14A:
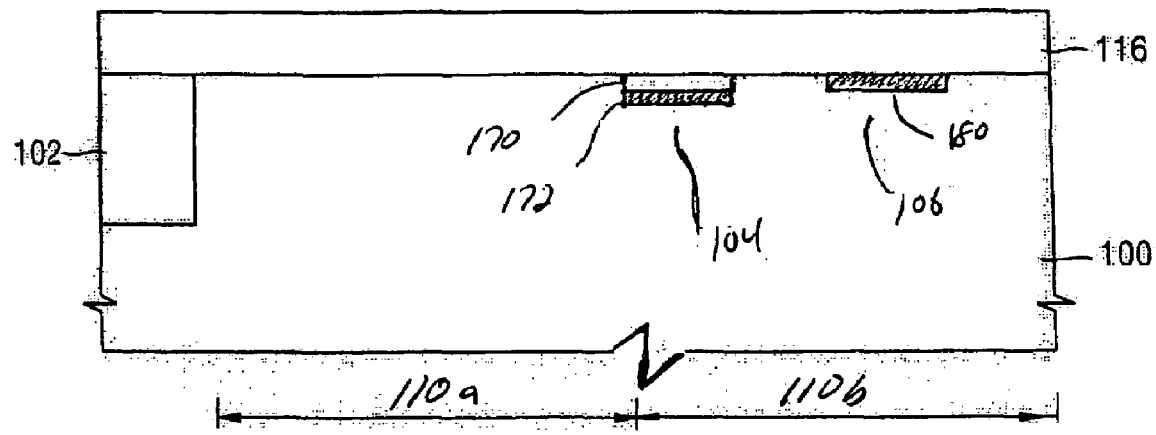
Figure 14B:
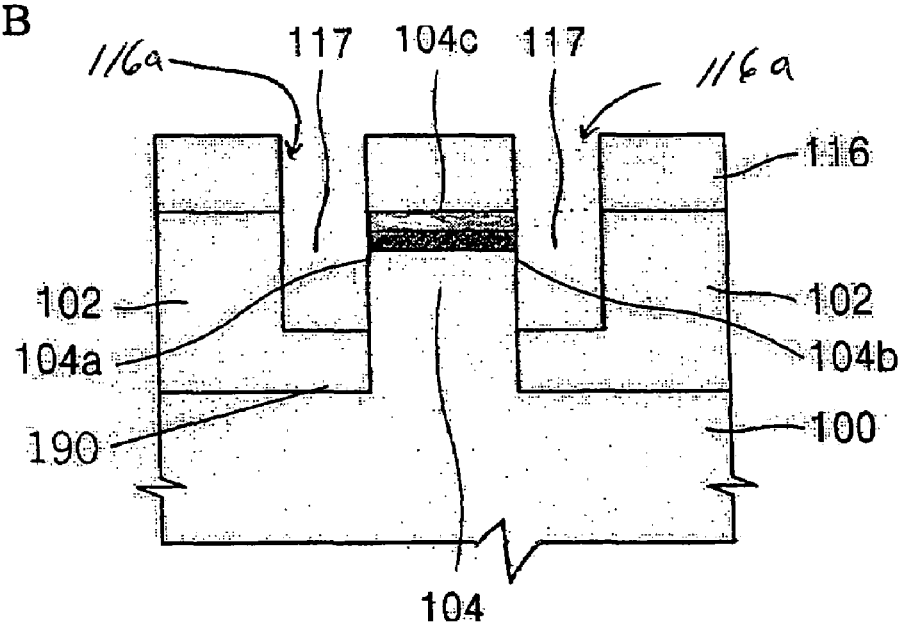

Referring to FIGS. 14A and 14B, the second photoresist pattern (114) is removed using conventional methods, and a third photoresist pattern (116) is formed over the substrate (100) having openings (116a) that expose portions of the isolation region (102) adjacent the channel region (104). A dry etching method is performed using the photoresist pattern (116) as a mask to etch recesses (117) into the exposed portions of the isolation region (102). The recesses (117) (as defined by openings 116a) are etched into the isolation layer (102) so as to expose, but not etch, the sidewalls (104a) and (104b) of the channel region (104). In one exemplary embodiment of the invention, the recesses (117) are formed to a depth that does not exceed a bottom level (190) of the isolation region (102). The recesses (117) can be etched using any suitable etching method including a dry etching method, wherein the amount of etching is based on a time period (knowing the etch rate of the material) or using an end point detection process which detects the color of plasma. In other embodiments, wet etching methods may be applied to etch the portions of the isolation region (102) exposed by openings (116a, 116b) using e.g., a DHF chemical (diluted HF, $H_2O$: HF=100:1).

During the etch process, it is preferable to avoid etching the active silicon of the channel region (104) since such etching can result in damage that causes dark current to be thermally generated at the interface between the vertical gate electrodes and vertical channels.

Figure 15A:
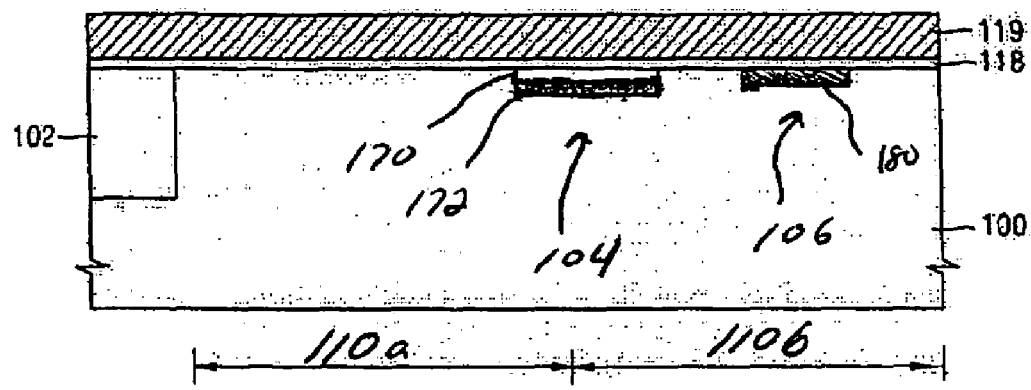
Figure 15B:
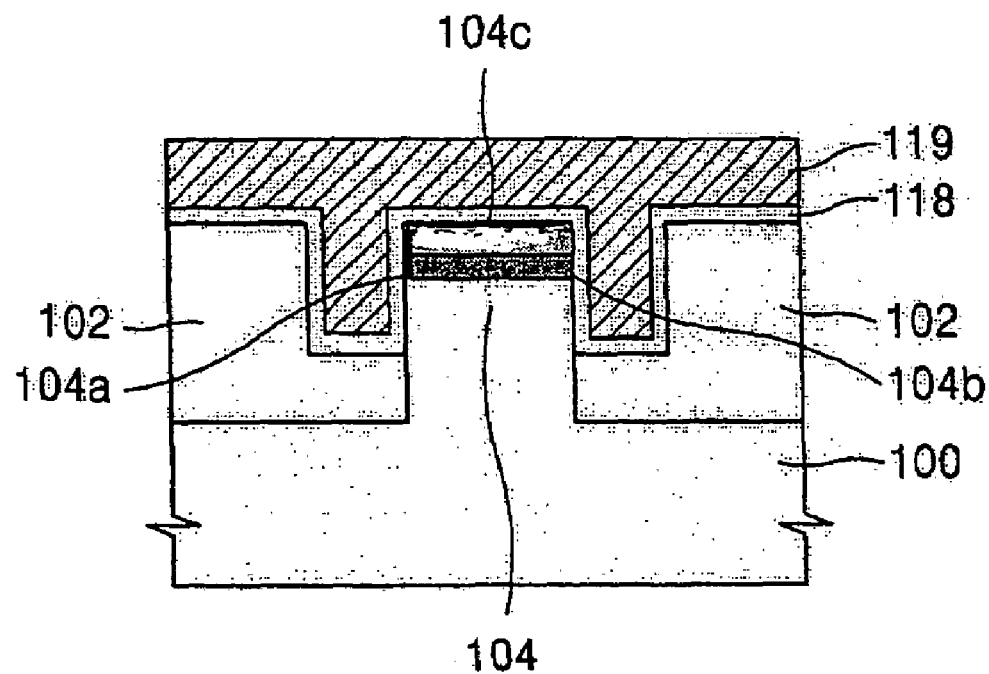

Referring to FIGS. 15A and 15B, the third photoresist pattern (116) is removed using conventional methods, and an insulating layer (118) and conductive layer (119) are sequentially formed on the substrate layer (100). The insulating layer (118) may be an oxide layer (or silicon oxide layer) that is formed by thermal oxidation. In other exemplary embodiments, the insulation layer (118) may be formed by depositing an insulating material such as silicon nitride, ONO, etc., using known methods such as CVD (chemical vapor deposition) or ALD (atomic layer deposition) methods. As depicted in FIG. 15B, the insulation layer (118) is formed as a thin conformal layer that lines the sidewalls and bottom surface of the etched recesses (117). Moreover, the conductive layer (119) may be formed by depositing conductive materials such as polysilicon, tungsten, copper, or other suitable gate electrode material, to fill the recesses (117) with such conductive material (119).

Figure 16A:
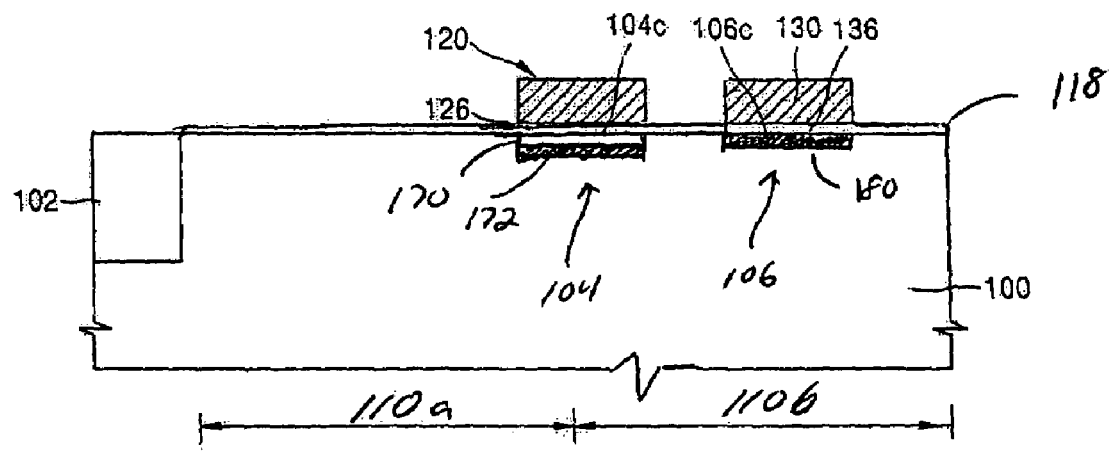
Figure 16B:
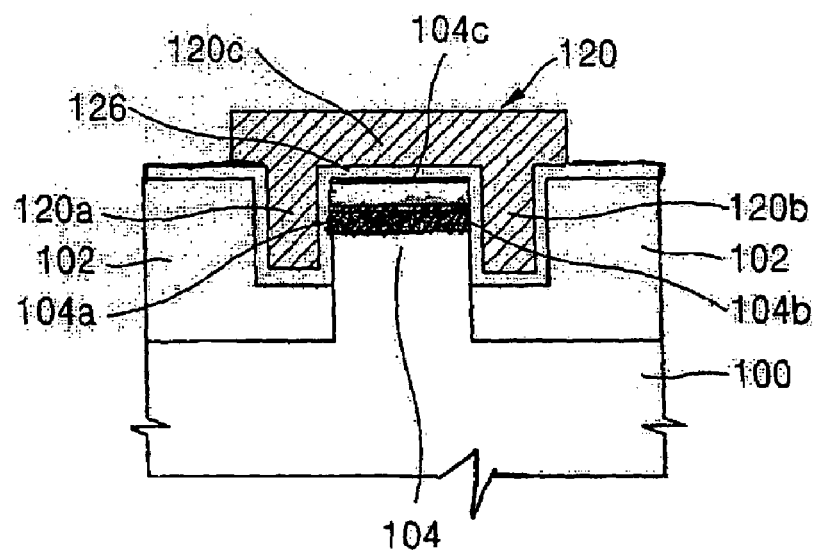

Referring to FIGS. 16A and 16B, an etch process is performed using a suitable mask pattern to form the gate electrodes (120) and (130) for the transfer TX and reset RX transistors. Although not shown, the gate electrodes for the amplifier transistor DX and select transistor SX can be formed using the same mask pattern and etch process. In one exemplary embodiment of the invention as depicted in FIG. 16A, the insulation layer (118) is maintained to protect the silicon substrate surface during subsequent etch processes. In another exemplary embodiment, the insulation layer (118) can be etched using the same etch mask for forming the gate electrodes, so as to define the gate insulation layers (126) and (136) for the transfer and reset gates (as well as the gate insulation layers for the amplifier and select transistors not shown).

Figure 17A:
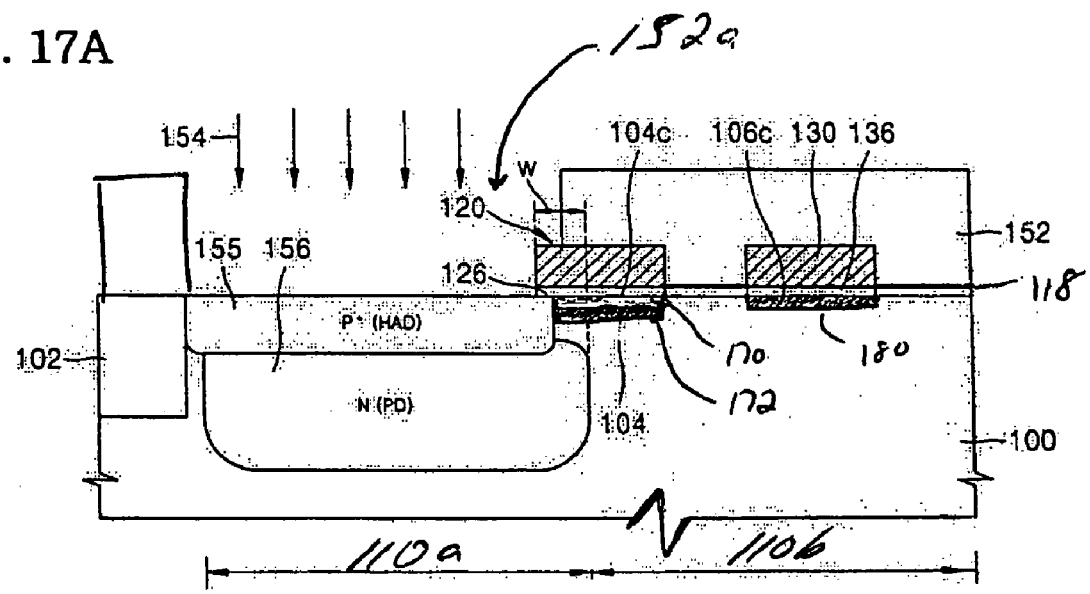
Figure 17B:
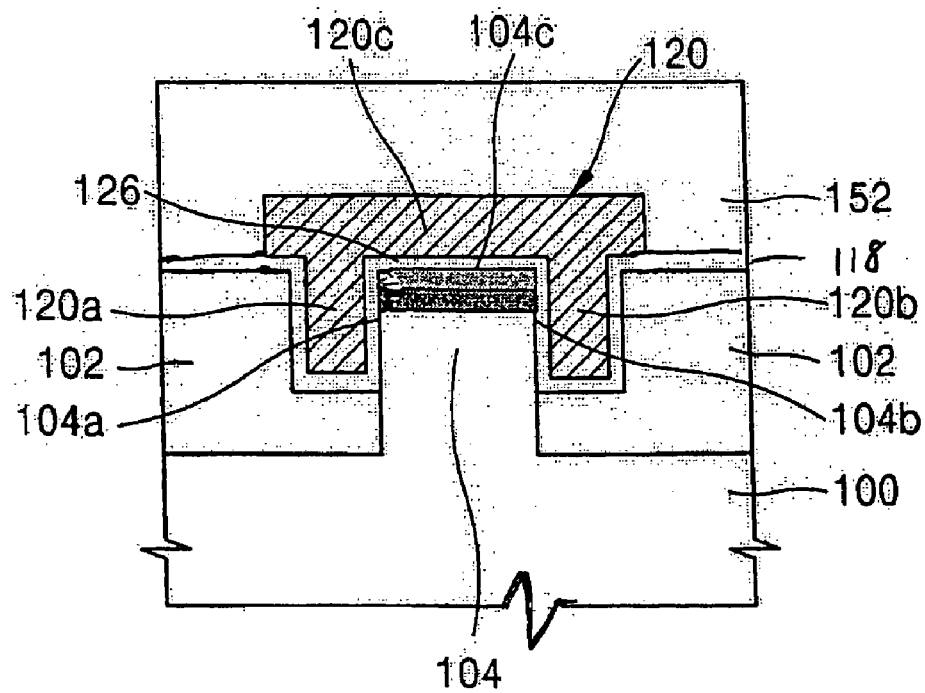

Referring to FIGS. 17A and 17B, a photoresist pattern (152) is formed having an opening (152a) that exposes and defines the PD region (110a). As depicted in FIG. 17A, the photoresist pattern (152) exposes a side portion of the transfer gate (120). Separate ion implantation methods (154) are performed to implant dopants into the exposed PD region (110a) to form the photodiodes. For example, a first implantation process is performed to implant p-type impurities, for example boron ions, into the exposed PD region (110a) with a first ion implantation energy to form the hole accumulation layer (155) layer. In this case, it is preferable that the first ion implantation energy is low so as to implant the p-dopants on the surface region of the semiconductor substrate (100). The boron ions implanted into the semiconductor substrate 100 are activated to form the p+ layer (155). A second ion implantation method is performed to implant n-type impurities (e.g., phosphorous or arsenic ions) into the exposed PD region (110a) with a second ion implantation energy to form the buried n-well layer (156).

In one exemplary embodiment, the n-type dopants that form the buried n-well layer (156) are implanted to a projection range (Rp) of about 0.3 microns to about 0.7 microns from the surface of the semiconductor substrate (100). With conventional pixel designs that implement planar gate electrodes, the Rp of the n-well layer (156) would be limited to 0.3 microns or less, otherwise significant image lag would occur. However, the use of vertical gate electrodes in accordance with the invention allows the n-well layer (156) to have a deeper Rp without causing image lag.

As depicted in the exemplary embodiment of FIG. 17A, the n-well layer (156) is formed in the substrate (100) to extend past the side of the transfer gate (120) by a distance W, which disposes the n-well layer (156) closer to the vertical gate electrodes (120a, 120b) and channels of the transfer transistor. In addition, the n-well layer (156) is formed such that the layer (156) does not contact the isolation region (102), which helps to minimize the effects of dark current defects at the interface between the isolation layer (102) and silicon substrate (100) due to the etching of the substrate (100) when forming the isolation layer (102).

Figure 18A:
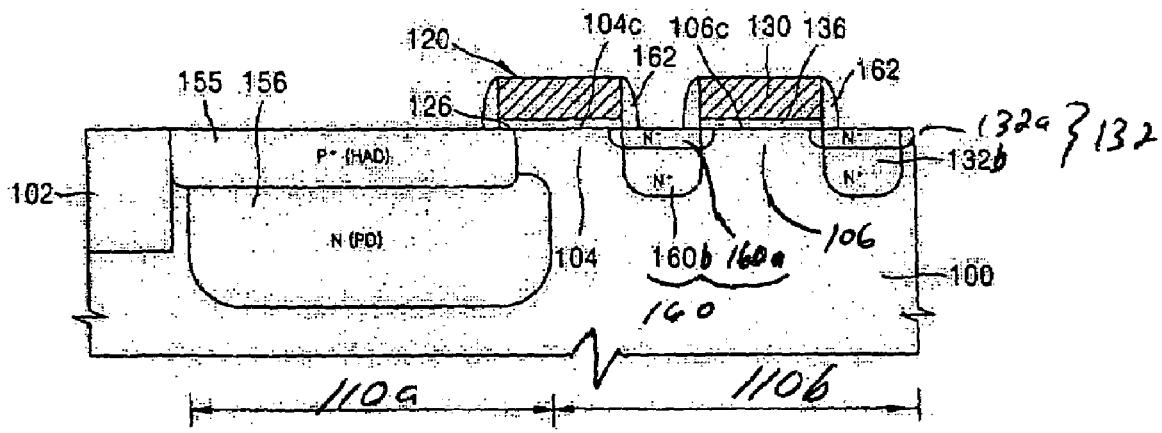
Figure 18B:
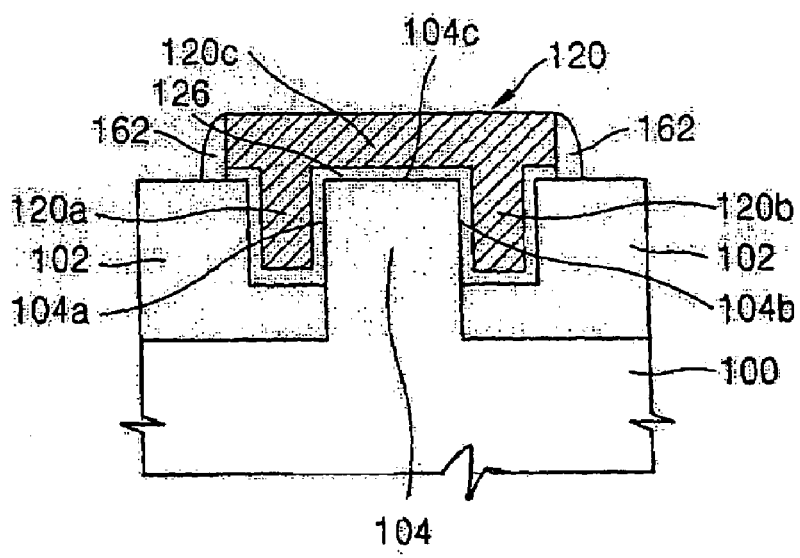

Referring to FIGS. 18A and 18B, the photoresist pattern (152) is removed using conventional methods (e.g., plasma ashing). Then, various methods are performed to form lightly doped n-type diffusion regions (160a) and (132a) by implanting n-type impurities into regions of the semiconductor substrate layer (100) adjacent the sides of the gates (120) and (130), but not in the PD region (110a). An insulation layer (e.g., nitride layer) is deposited and etched to form sidewall spacers (126) and (136) on the sides of the gate electrodes (120) and (130) (as well as the amplifier and select gate electrodes not shown). Next, impurities are implanted into the active region to form the n-type heavily doped diffusion layers (160b) and (132b), wherein the n-type heavily doped diffusion layers are aligned using the outer edges of the sidewall spacers (162). It is to be understood that the gate spacers (162) and doped regions (160) and (132) can be formed using any suitable method known to those of ordinary skill in the art, and a detailed discussion thereof is not necessary.

FIGS. 19A~B through 22A~B are diagrams that illustrate a method for manufacturing an image sensor device according to another exemplary embodiment of the invention. More specifically, FIGS. 19A-B through 22A-B illustrate a method for fabricating an image sensor device having the exemplary unit pixel architecture (22-2) discussed above with reference to FIGS. 5A~5C, for example. In this regard, FIGS. 19A~22A illustrate various fabrication stages of the exemplary pixel unit (22-1) from the viewpoint of FIG. 5A and FIGS. 19B~22B illustrate the various fabrication stages of the exemplary pixel unit (22-2) from the viewpoint of FIG. 5B.

Figure 19A:
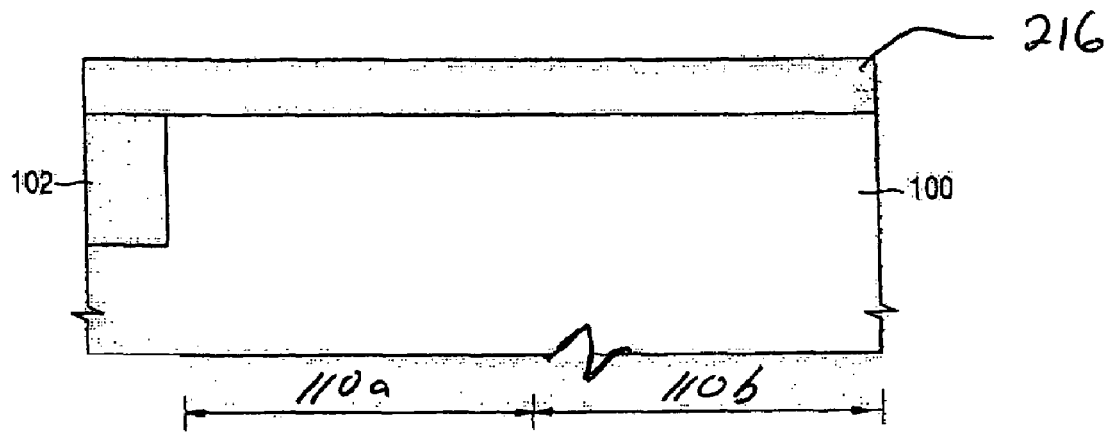
FIGS. 19A~B through 22A~B are diagrams that illustrate a method for manufacturing an image sensor device according to another exemplary embodiment of the invention.
Figure 19B:
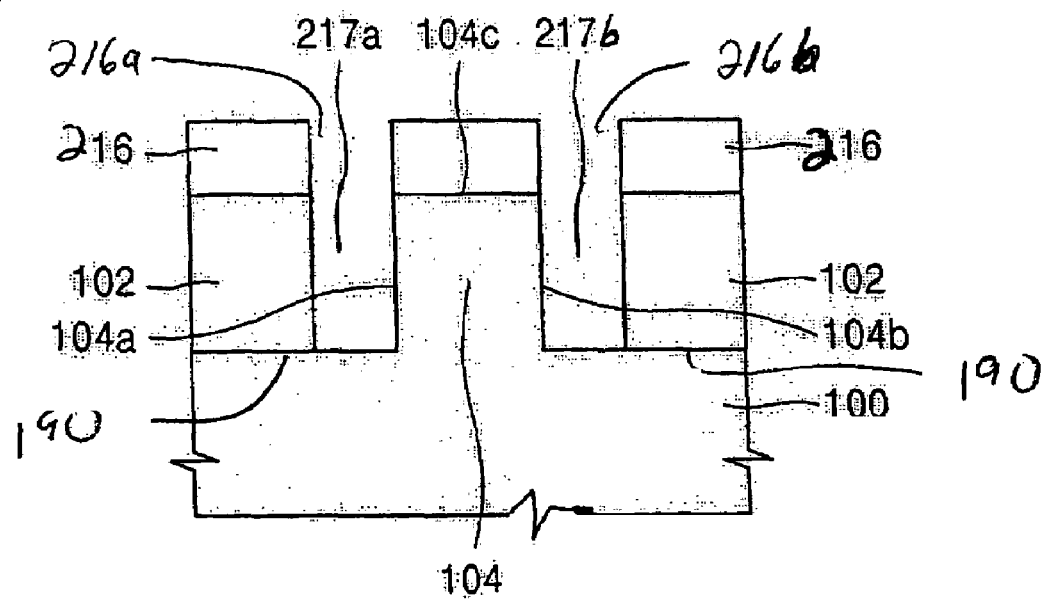

Referring to FIGS. 19A and 19B, a photoresist pattern (216) is formed over a semiconductor substrate having substrate layer (100) and isolation region (102), which are formed as described above. The photoresist pattern (216) has openings (216a) and (216b) that expose portions of the isolation region (102) adjacent the channel region (104). A dry etching method is performed using the photoresist pattern (116) as a mask to etch recesses (217a) and (217b) into the exposed portions of the isolation region (102). The recesses (217a) and (217b) (as defined by respective openings 216a and 216b) are etched into the isolation layer (102) so as to expose, but not etch, the respective sidewalls (104a) and (104b) of the channel region (104). In one exemplary embodiment of the invention, the recesses (117a) and (117b) are formed to a depth that does not exceed a bottom level (190) of the isolation region (102). Again, as noted above, during the etch process, it is preferable to avoid etching the active silicon of the channel region (104) since such etching can result in damage that causes dark current to be thermally generated at the interface between the vertical gate electrodes and vertical channels.

Figure 20A:
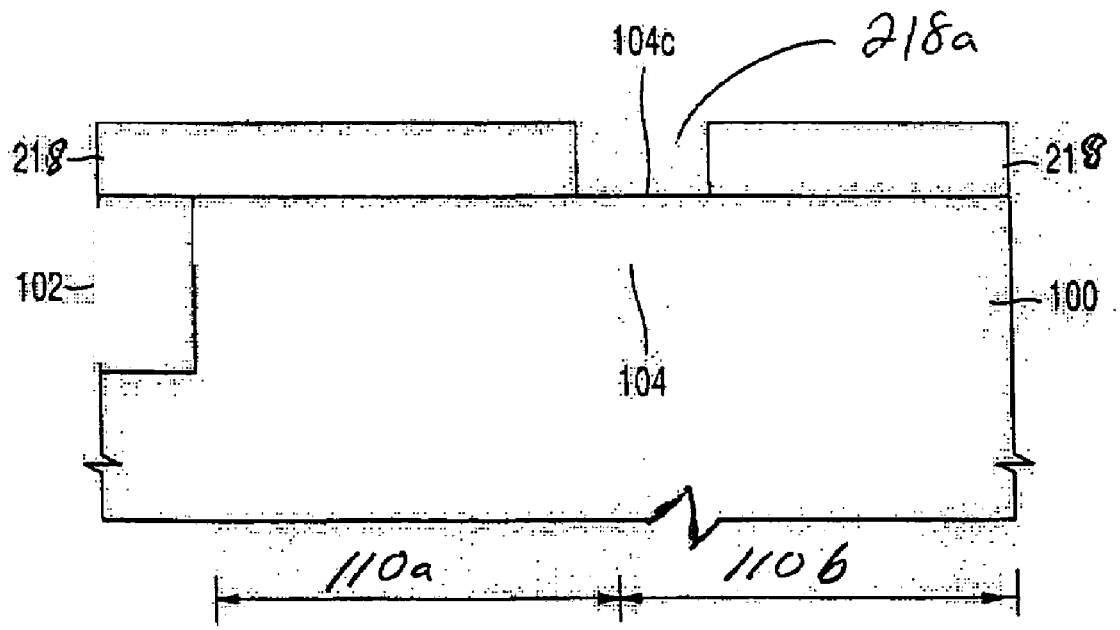
Figure 20B:
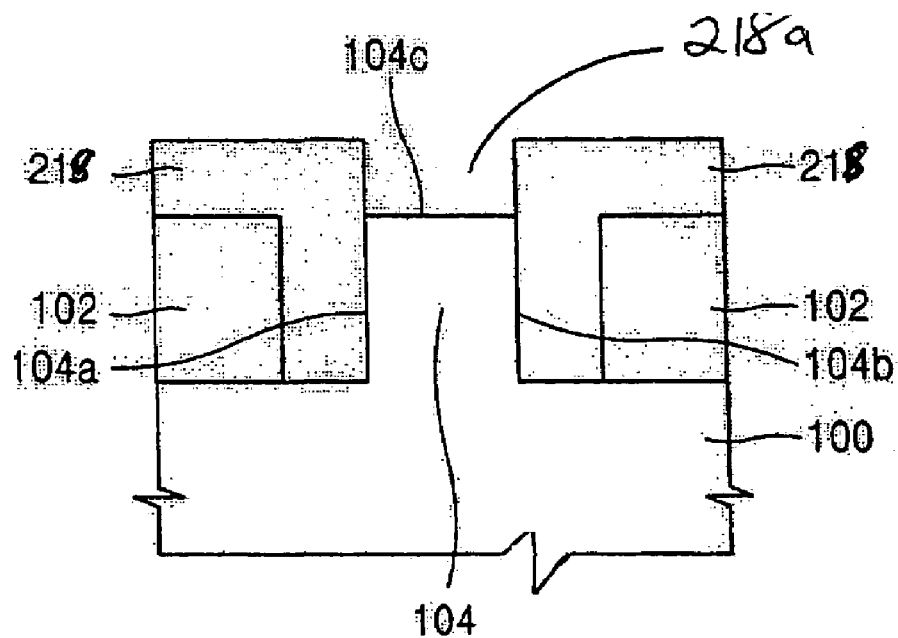
Figure 21A:
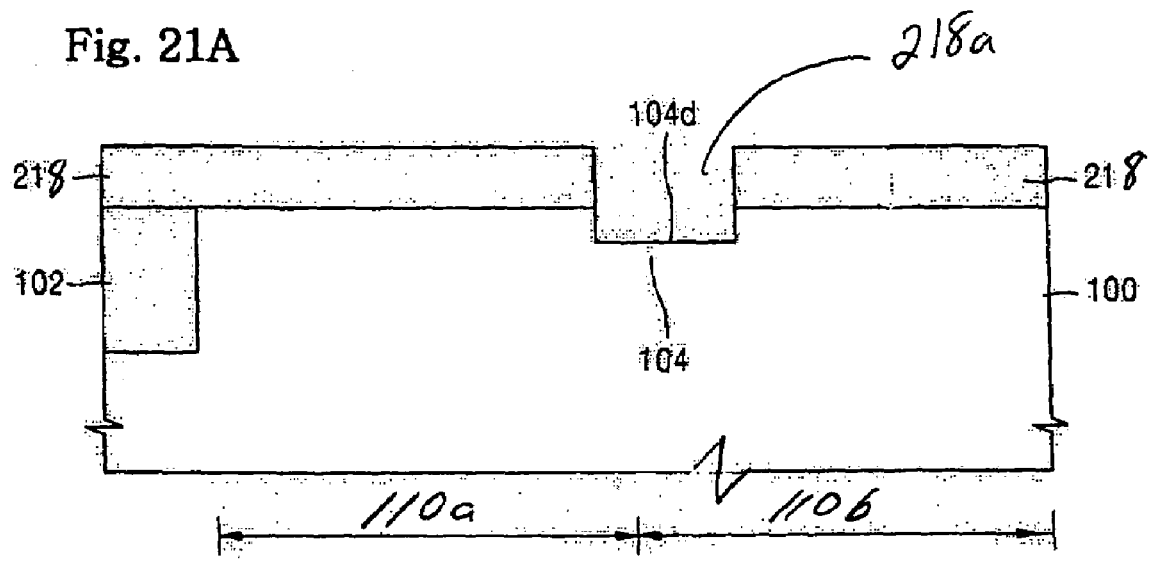
Figure 21B:
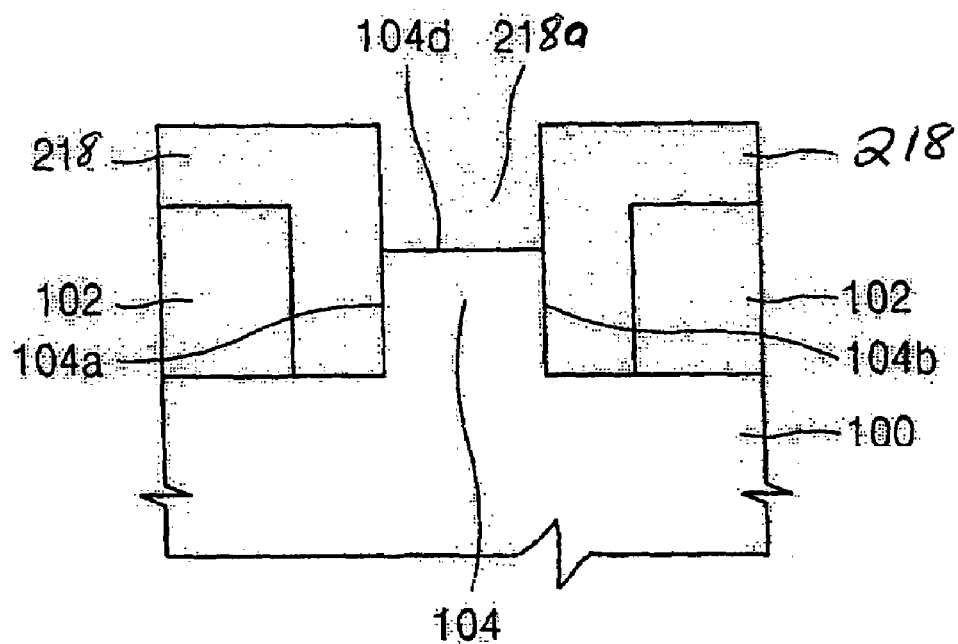

Referring to FIGS. 20A and 20B, the photoresist pattern (216) is removed and a photoresist pattern (218) is formed having an opening (218a) that defines and exposes the upper surface (104c) of the channel region (104) of the transfer transistor TX, and which fills the recesses (217a) and (217b) formed in the isolation region (102). Referring to FIGS. 21A and 21B, an etching process is performed using the photoresist pattern (218) as a mask to etch the exposed surface (104c) of the channel region (104) and form recessed surface (104d), which allows a decrease in the physical distance between the center of the buried n-well layer (156) and the channel region of the transfer gate (120). In one exemplary embodiment, this etching process may be performed using a dry etching process using $Cl_2$, HBr and $O_2$ gases.

Figure 22A:
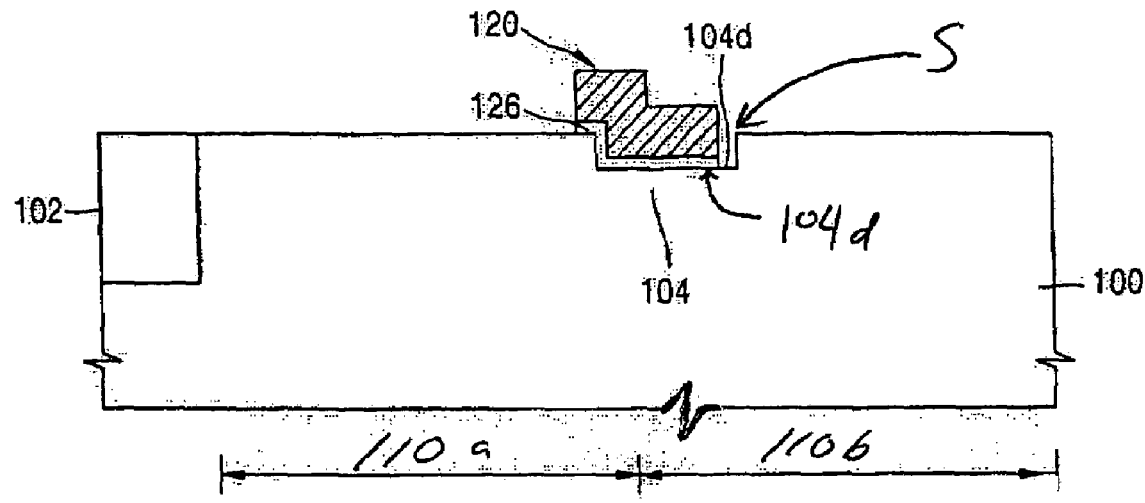
Figure 22B:
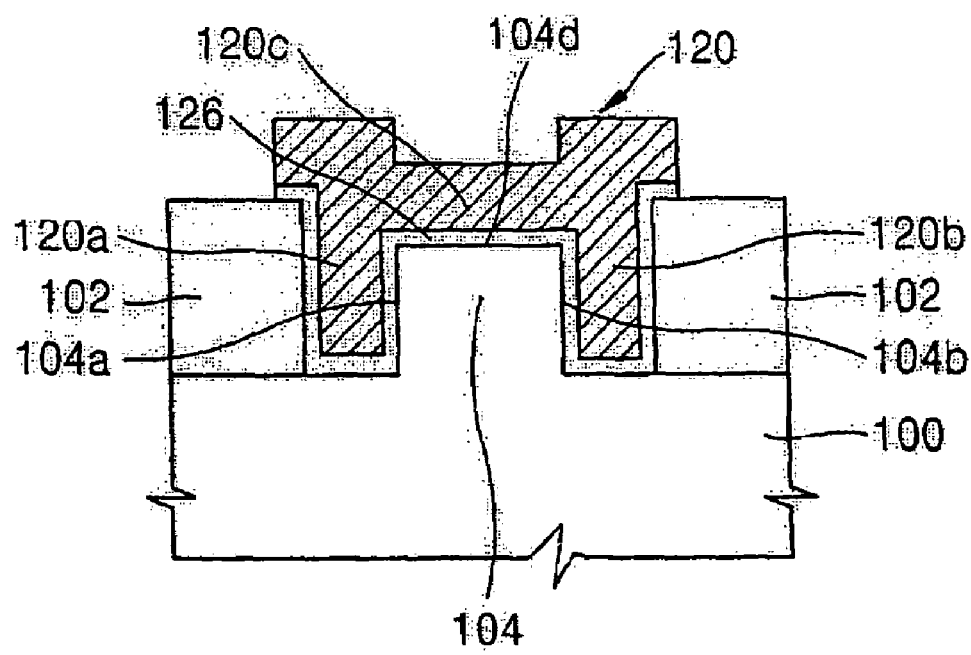

Referring to FIGS. 22A and 22B, after removing the photoresist pattern (216), the transfer gate (120) and gate oxide (126) can be formed by depositing and etching an insulating layer and conductive layer using known materials and methods, together with gate structures for the other pixel transistors. As depicted in FIG. 22B, the gate insulation layer (126) is formed as a thin conformal layer that lines the sidewalls and bottom surface of the etched recesses (217a and 217b) and the recesses (217a and 217b) are filled with the conductive material to form vertical gate electrodes (120a) and (120b). As depicted in FIG. 22A, the gate electrode (120) and insulation layer (126) are formed such that a space S is formed between the sidewalls of the gate electrode (120) and silicon substrate (100) in the recessed region. As noted above, the space S is filled with spacer insulation material to insulate the gate electrode (120) from the doped layers forming the FD region in the substrate (100). FIG. 22A shows the gate electrode (120), the gate insulating layer (126), the recessed surface (104d) and the space S in the substrate (100). However the left portion of the gate electrode (120) which covers the top and the recessed surface of the substrate is duplicated to the right portion of the gate electrode without the space S (as clearly depicted in FIG. 5C).

After forming the gate electrodes, methods such as described above with reference to FIGS. 17A-B and 18A-B can be used to form the doped layers in the PD region (110a) and active transistor region (110b) to form the PD element and source/drain regions for the various pixel transistors.

It is to be appreciated that image sensor devices having exemplary unit pixels (22-3), (22-4) and (22-5) or (22-6) can be fabricated using the same or similar processing steps as described above, and a detailed discussion thereof is not necessary.

Figure 23:
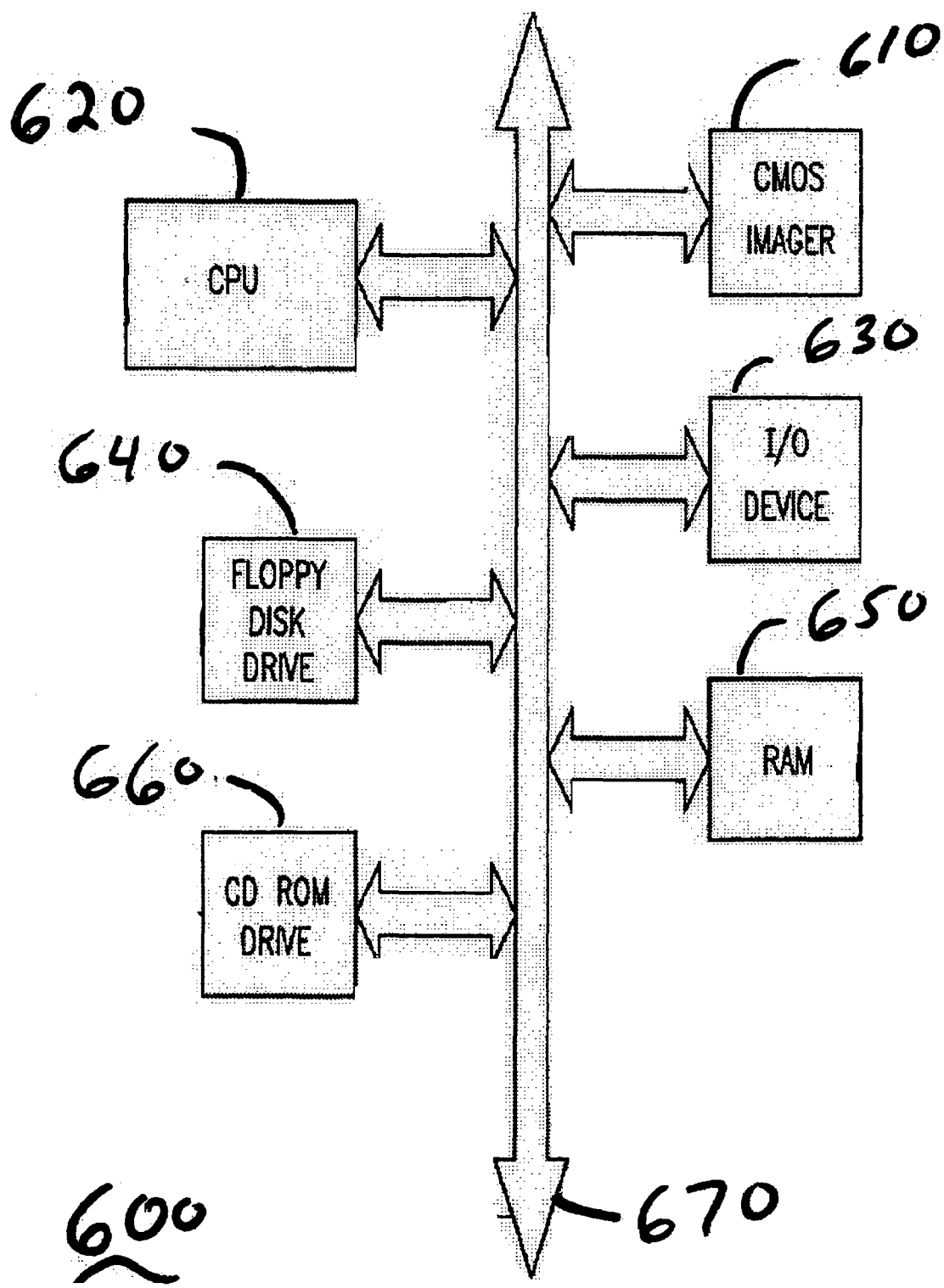
FIG. 23 is a high-level block diagram of a system which implements an imaging device according to an exemplary embodiment of the invention.

It is to be further appreciated that CMOS image sensor devices having pixel arrays constructed with pixels according to exemplary embodiments of the invention may be implemented in various types of processor-based systems. For example, FIG. 23 is a high-level block diagram of a system (600) having an image sensor device according to an exemplary embodiment of the invention. The system (600) may be implemented in, for example, a computer system, camera system, scanner, machine vision system, vehicle navigation system, video phone, surveillance system, auto focus system, star tracker system, motion detection system, image stabilization system, mobile phone, and other processor-based systems.

In general, the system (600) comprises a CMOS imager device (610), one or more CPUs (central processing units) or microprocessors (620), one or more I/I devices (630), a floppy disk drive (640) (or other memory card slots), RAM (650) and a CD ROM drive (660), all of which are operatively coupled via a system bus (670). The types of system components implemented will vary depending on the type of system. For instance, the peripheral devices such as floppy disk drive (640) and CD ROM drive (660) are typically employed with personal computers or laptop computers, for example.

The CMOS imager device (610) comprises a pixel array that may be constructed using any one of the exemplary pixel architectures described herein. The CMOS imager device (610) produces an output image from signals supplied from the pixel array. The CMOS imager device (610) communicates with the system components over the bus (670) or other communication links. In other exemplary embodiments, the processor (620), CMOS imager device (610) and memory (650) may be integrally formed on a single IC chip.

Although exemplary embodiments have been described herein with reference to the accompanying drawings, it is to be understood that the invention is not limited to the exemplary embodiments described herein, and that various other changes and modifications may be readily envisioned by one of ordinary skill in the art without departing form the scope or spirit of the invention. All such changes and modifications are intended to be included within the scope of the invention as defined by the appended claims.

I claim:

1. An image sensor device, comprising:
   a semiconductor substrate comprising a plurality active regions defined by an isolation layer formed in the semiconductor substrate; and a pixel array comprising a plurality of pixels, wherein each pixel is formed in one of said active regions, wherein each pixel comprises:
a light receiving element; and
a charge transfer element to transfer charge from the light receiving element, wherein the charge transfer element comprises:
a mesa-type channel region in the active region of the pixel to transfer said charge, the mesa-type channel region comprising two vertical sidewalls and a horizontal upper surface between upper ends of the two vertical sidewalls,
two vertical gate electrodes formed in the isolation layer and disposed adjacent to the vertical sidewalls, respectively, and
insulating material disposed between the vertical sidewalls and vertical gate electrodes.

2. The image sensor device of claim 1, wherein the charge transfer element further comprises a horizontal gate electrode disposed adjacent to the horizontal upper surface, and insulating material disposed between the horizontal upper surface and horizontal gate electrode.

3. The image sensor device of claim 2, wherein the horizontal gate electrode is formed on a surface of the semiconductor substrate.

4. The image sensor device of claim 2, wherein at least a portion of the horizontal gate electrode is disposed in a recess formed in the surface of the semiconductor substrate.

5. The image sensor device of claim 2, wherein the horizontal gate electrode is L-shaped.

6. The image sensor device of claim 2, wherein the horizontal gate electrode is rectangular-shaped.

7. The image sensor device of claim 2, wherein the vertical gate electrodes are connected to, and extend from, a portion of the horizontal gate electrode that overlaps the isolation layer.

8. The image sensor device of claim 1, wherein the light receiving element is a photodiode.

9. The image sensor device of claim 1, wherein the light receiving element is a pinning photodiode.

10. The image sensor device of claim 1, wherein the light receiving element comprises a hole accumulation diode (HAD) formed in the active region, and an n-well region formed below the HAD.

11. The image sensor device of claim 10, wherein at least one of the vertical gate electrodes is formed to a depth to be adjacent to at least a portion of the n-well region.

12. The image sensor device of claim 1, wherein at least one of the vertical gate electrodes is formed to a depth to be adjacent to a least a portion of a charge accumulation region of the light receiving element.

13. The image sensor device of claim 1, further comprising:
a floating diffusion region formed in the active region of the pixel adjacent to the charge transfer element, which stores charge transferred from the charge transfer element;
a pixel reset element to reset a voltage of the floating diffusion region, wherein the floating diffusion region is a common diffusion region for the charge and reset transfer elements.

14. The image sensor device of claim 13, wherein the pixel reset element comprises:
a vertical channel region in the active region of the pixel;
a vertical gate electrode formed in the isolation layer and disposed adjacent to the vertical channel region; and
insulating material disposed between the vertical channel region and the vertical gate electrode.

15. The image sensor device of claim 1, wherein the pixel array is an active pixel array.

16. The image sensor device of claim 1, wherein the image sensor device is a CMOS image sensor.

17. The image sensor device of claim 1, wherein the charge transfer element further comprises a buried channel layer formed in the active region between a source and drain region of the charge transfer element, wherein the buried channel layer and source and drain regions are doped with an impurity of a first conductivity type, and wherein the active region is doped with an impurity of a second conductivity type.

18. The image sensor device of claim 17, wherein the charge transfer element further comprises a pinning layer formed in a surface of the active region above the buried channel layer between the source and drain regions, wherein the pinning layer is doped with an impurity of the second conductivity type.

19. An image sensor device, comprising:
a semiconductor substrate comprising a pixel array having a plurality active regions defined by an isolation layer; and
at least one pixel in the pixel array comprising a light receiving element, a charge transfer element and a floating diffusion region operatively connected to an amplifier transistor;
wherein a gate electrode of the charge transfer element comprises a mesa-type channel region in the active region of the pixel to transfer charges from the light receiving element, the mesa-type channel region comprising two vertical sidewalls and a horizontal upper surface between upper ends of the two vertical sidewalls.

20. The image sensor device of claim 19, wherein the gate electrode of the charge transfer element forms a surface channel.

21. The image sensor device of claim 19, wherein the gate electrode of the charge transfer element forms a recessed surface channel.

22. An image sensor device comprising active pixels formed in a substrate, wherein at least one active pixel comprises:
a light receiving element;
a reset transistor;
a charge transfer element;
a floating diffusion region; and
an amplifier transistor;
wherein the reset transistor, the charge transfer element or the amplifier transistor comprises a mesa-type channel region comprising two vertical sidewalls and a horizontal upper surface between upper ends of the two vertical sidewalls.

* * * * *